(12) United States Patent
Yamazaki et al.

(10) Patent No.: US 8,587,999 B2
(45) Date of Patent: Nov. 19, 2013

(54) SEMICONDUCTOR DEVICE

(71) Applicant: Semiconductor Energy Laboratory Co., Ltd., Atsugi (JP)

(72) Inventors: Shunpei Yamazaki, Tokyo (JP); Jun Koyama, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/672,973

(22) Filed: Nov. 9, 2012

(65) Prior Publication Data

US 2013/0099299 A1    Apr. 25, 2013

Related U.S. Application Data

(63) Continuation of application No. 12/987,302, filed on Jan. 10, 2011, now Pat. No. 8,339,836.

(30) Foreign Application Priority Data

Jan. 15, 2010 (JP) ................ 2010-007517

(51) Int. Cl.
*G11C 16/04* (2006.01)
*G11C 11/24* (2006.01)

(52) U.S. Cl.
USPC ............... 365/185.08; 365/149; 365/185.01

(58) Field of Classification Search
USPC .................................. 365/185.08
See application file for complete search history.

(56) References Cited

U.S. PATENT DOCUMENTS

| | | | |
|---|---|---|---|
| 4,466,081 A | 8/1984 | Masuoka |
| 4,771,323 A | 9/1988 | Sasaki |
| 4,920,391 A | 4/1990 | Uchida |

(Continued)

FOREIGN PATENT DOCUMENTS

| | | | |
|---|---|---|---|
| EP | 0053878 A2 | 6/1982 |
| EP | 1737044 A1 | 12/2006 |

(Continued)

OTHER PUBLICATIONS

International Search Report (Application No. PCT/JP2010/073643), dated Mar. 22, 2011.

(Continued)

*Primary Examiner* — Son Mai
(74) *Attorney, Agent, or Firm* — Fish & Richardson P.C.

(57) ABSTRACT

An object is to provide a semiconductor device with a novel structure in which stored data can be retained even when power is not supplied, and does not have a limitation on the number of times of writing operations. A semiconductor device includes a source-bit line, a first signal line, a second signal line, a word line, and a memory cell connected between the source-bit lines. The memory cell includes a first transistor, a second transistor, and a capacitor. The second transistor is formed including an oxide semiconductor material. A gate electrode of the first transistor, one of a source and drain electrodes, and one of electrodes of the capacitor are electrically connected to one another. The source-bit line and a source electrode of the first transistor are electrically connected to each other. Another source-bit line adjacent to the above source-bit line and a drain electrode of the first transistor are electrically connected to each other.

14 Claims, 20 Drawing Sheets

(56) References Cited

U.S. PATENT DOCUMENTS

| | | |
|---|---|---|
| 4,935,896 A | 6/1990 | Matsumura et al. |
| 5,220,530 A | 6/1993 | Itoh |
| 5,349,366 A | 9/1994 | Yamazaki et al. |
| 5,675,160 A | 10/1997 | Oikawa |
| 5,731,856 A | 3/1998 | Kim et al. |
| 5,744,864 A | 4/1998 | Cillessen et al. |
| 5,995,410 A | 11/1999 | Forbes |
| 6,127,702 A | 10/2000 | Yamazaki et al. |
| 6,294,274 B1 | 9/2001 | Kawazoe et al. |
| 6,314,017 B1 | 11/2001 | Emori et al. |
| 6,445,026 B1 | 9/2002 | Kubota et al. |
| 6,465,834 B1 | 10/2002 | Nakazato et al. |
| 6,501,116 B2 | 12/2002 | Kisu et al. |
| 6,563,174 B2 | 5/2003 | Kawasaki et al. |
| 6,576,943 B1 | 6/2003 | Ishii et al. |
| 6,680,864 B2 | 1/2004 | Noble |
| 6,727,522 B1 | 4/2004 | Kawasaki et al. |
| 6,876,023 B2 | 4/2005 | Ishii et al. |
| 7,016,219 B1 | 3/2006 | Davies |
| 7,023,721 B2 | 4/2006 | Itoh et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,170,792 B2 | 1/2007 | Hanzawa et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2003/0227041 A1 | 12/2003 | Atwood et al. |
| 2004/0038446 A1 | 2/2004 | Takeda et al. |
| 2004/0127038 A1 | 7/2004 | Carcia et al. |
| 2004/0164326 A1 | 8/2004 | Atwood et al. |
| 2005/0017302 A1 | 1/2005 | Hoffman |
| 2005/0199959 A1 | 9/2005 | Chiang et al. |
| 2005/0205921 A1 | 9/2005 | Ishii et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2010/0276689 A1 | 11/2010 | Iwasaki |
| 2010/0279462 A1 | 11/2010 | Iwasaki |
| 2011/0101339 A1 | 5/2011 | Yamazaki et al. |
| 2011/0101351 A1* | 5/2011 | Yamazaki ....................... 257/57 |
| 2011/0122673 A1* | 5/2011 | Kamata et al. ................ 365/114 |
| 2011/0156028 A1 | 6/2011 | Yamazaki et al. |

FOREIGN PATENT DOCUMENTS

| | | |
|---|---|---|
| EP | 2226847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| JP | 2007-042172 A | 2/2007 |
|---|---|---|
| WO | WO 2004/114391 A1 | 12/2004 |
| WO | WO 2007/029844 A1 | 3/2007 |

OTHER PUBLICATIONS

Written Opinion (Application No. PCT/JP2010/073643), dated Mar. 22, 2011.
Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.
Kim, W et al., "An Experimental High-Density DRAM Cell with a Built-in Gain Stage," IEEE Journal of Solid-State Circuits, Aug. 1, 1994, vol. 29, No. 8, pp. 978-981.
Shukuri, S et al., "A Complementary Gain Cell Technology for Sub-1 V Supply DRAMs," IEDM 92: Technical Digest of International Electron Devices Meeting, Dec. 13, 1992, pp. 1006-1008.
Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUs on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YbFe2O4, and Yb2Fe3O7 Types of Structures for Compounds in the $In_2O_3$ and $Sc_2O_3$-$A_2O_3$-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$-$ZnGa_2O_4$-ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUs on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

(56) References Cited

OTHER PUBLICATIONS

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide.Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

SEMICONDUCTOR DEVICE

CROSS-REFERENCE TO RELATED APPLICATIONS

This application is a continuation of U.S. application Ser. No. 12/987,302, filed Jan. 10, 2011, now allowed, which claims the benefit of a foreign priority application filed in Japan as Serial No. 2010-007517 on Jan. 15, 2010, both of which are incorporated by reference.

TECHNICAL FIELD

The invention disclosed herein relates to a semiconductor device using a semiconductor element and a method for manufacturing the semiconductor device.

BACKGROUND ART

Storage devices using semiconductor elements are broadly classified into two categories: a volatile memory device that loses stored data when power supply stops, and a non-volatile memory device that retains stored data even when power is not supplied.

A typical example of a volatile storage device is a DRAM (dynamic random access memory). A DRAM stores data in such a manner that a transistor included in a storage element is selected and charge is stored in a capacitor.

When data is read from a DRAM, charge in a capacitor is lost on the above-described principle; thus, another writing operation is needed when data is stored again after data is read. A data storage period is short because charge flows from/into a transistor forming a memory element by leakage current between a source and a drain in an off state (off-state current) or the like even when the transistor is not selected. For that reason, another writing operation (refresh operation) is necessary at predetermined intervals, and it is difficult to reduce power consumption sufficiently. Furthermore, since stored data is lost when power supply stops, an additional storage device including a magnetic material or an optical material is needed in order to hold the data for a long time.

Another example of a volatile storage device is an SRAM (static random access memory). An SRAM retains stored data by using a circuit such as a flip-flop and thus does not need refresh operation; on this point, an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region of a transistor and stores data by holding charge in the floating gate. Therefore, a flash memory has advantages that the data storage period is extremely long (almost permanent) and refresh operation which is necessary in a volatile storage device is not needed (e.g., see Patent Document 1).

However, a gate insulating layer included in a memory element deteriorates by a tunneling current which flows in writing operation, so that the memory element stops its function after a numerous number of times of writing operations. In order to avoid this problem, a method in which the number of times of writing operations for memory elements is equalized is employed, for example. However, complicated peripheral circuits are additionally needed to realize this method. Moreover, employing such a method does not solve the lifetime problem, which is fundamental. In other words, a flash memory is not suitable for applications in which data is frequently rewritten.

In addition, high voltage is necessary for injecting charge to the floating gate or removing the charge. Further, it takes a relatively long time to inject or remove charge, and it is not easy to perform writing and erasing data at higher speed.

REFERENCE

Patent Document

[Patent Document 1] Japanese Published Patent Application No. S57-105889

DISCLOSURE OF INVENTION

In view of the foregoing problems, an object of one embodiment of the invention disclosed is to provide a semiconductor device with a novel structure in which stored data can be retained even when power is not supplied, and does not have a limitation on the number of times of writing operations.

In the disclosed invention, a semiconductor device is formed using a highly-purified oxide semiconductor. The leakage current of a transistor including a highly-purified oxide semiconductor is extremely low, whereby data can be stored for a long time.

One embodiment of the disclosed invention is a semiconductor device including a plurality of source-bit lines extended in a column direction, a plurality of first signal lines extended in the column direction, a plurality of second signal lines extended in a row direction, a plurality of word lines extended in the row direction, a plurality of memory cells connected in parallel between the source-bit lines, a first driver circuit electrically connected to the source-bit lines, a second driver circuit electrically connected to the first signal lines, a third driver circuit electrically connected to the second signal lines, and a fourth driver circuit electrically connected to the word lines. In the semiconductor device, one of the source-bit lines used in common by two memory cells adjacent to each other in the same row. One of the memory cells includes a first transistor including a first gate electrode, a first source electrode, and a first drain electrode, a second transistor including a second gate electrode, a second source electrode, and a second drain electrode, and a capacitor. The second transistor is formed including an oxide semiconductor material. The first gate electrode, one of the second source and drain electrodes, and one of electrodes of the capacitor are electrically connected to one another. One of the source-bit lines and the first source electrode are electrically connected to each other. Another source-bit line adjacent to the one of the source-bit lines and the first drain electrode are electrically connected to each other. One of the first signal lines and the other of the second source and drain electrodes are electrically connected to each other. One of the second signal lines and the second gate electrode are electrically connected to each other. One of the word lines and the other of the electrodes of the capacitor are electrically connected to each other.

Note that it is preferable that there is (n+1) (n is a natural number) source-bit lines, n first signal lines, m (m is a natural number) second signal lines, m word lines, (m×n) memory cells.

One embodiment of the disclosed invention is a semiconductor device including a plurality of source-bit lines extended in a column direction, a plurality of first signal lines extended in a row direction, a plurality of second signal lines extended in the column direction, a plurality of word lines extended in the row direction, a plurality of memory cells connected in parallel between the source-bit lines, a first driver circuit electrically connected to the source-bit lines, a second driver circuit electrically connected to the first signal lines, a third driver circuit electrically connected to the second signal lines, and a fourth driver circuit electrically connected to the word lines. In the semiconductor device, one of the source-bit lines is used in common by two memory cells adjacent to each other in the same row. One of the memory cells includes a first transistor including a first gate electrode, a first source electrode, and a first drain electrode, a second transistor comprising a second gate electrode, a second source electrode, and a second drain electrode, and a capacitor. The second transistor is formed including an oxide semiconductor material. The first gate electrode, one of the second source and drain electrodes, and one of electrodes of the capacitor are electrically connected to one another. One of the source-bit lines and the first source electrode are electrically connected to each other. Another source-bit line adjacent to the one of the source-bit lines and the first drain electrode are electrically connected to each other. One of the first signal lines and the other of the second source and drain electrodes are electrically connected to each other. One of the second signal lines and the second gate electrode are electrically connected to each other. One of the word lines and the other of the electrodes of the capacitor are electrically connected to each other.

Note that it is preferable that there is (n+1) (n is a natural number) source-bit lines, m (m is a natural number) first signal lines, n second signal lines, m word lines, (m×n) memory cells.

Further, the first transistor is preferably formed including single crystal silicon.

It is preferable that the first transistor includes a first channel formation region including a semiconductor material other than an oxide semiconductor, impurity regions between which the channel formation region is provided, a first gate insulating layer over the channel formation region, the first gate electrode over the first gate insulating layer, and the first source electrode and the first drain electrode which are electrically connected to the impurity regions.

Note that although a transistor is formed including an oxide semiconductor material in the above description, the disclosed invention is not limited thereto. A material which can realize the off-state current characteristics similar to those of an oxide semiconductor material may be employed; for example, a wide band gap material (specifically, for example, a semiconductor material whose energy gap Eg is larger than 3 eV) typified by silicon carbide may be employed.

The second transistor preferably includes the second source electrode and the second drain electrode above the first transistor, a second channel formation region including an oxide semiconductor material and electrically connected to the second source electrode and the second drain electrode, a second gate insulating layer over the second channel formation region, and the second gate electrode over the second gate insulating layer.

The capacitor preferably includes the second source electrode or the second drain electrode, an oxide semiconductor layer including the oxide semiconductor material, the second gate insulating layer, and a capacitor electrode over the second gate insulating layer.

Note that in this specification, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Moreover, the terms such as "over" and "below" are only used for convenience of description and include the case where the relation of components is reversed, unless otherwise specified.

In addition, in this specification, the term such as "electrode" or "line" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

Note that in this specification, the term "electrically connected" includes the case where components are connected through an object having any electric function. There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since the off-state current of a transistor including an oxide semiconductor is extremely low, stored data can be stored for an extremely long time with the use of the transistor. In other words, power consumption can be adequately reduced because refresh operation becomes unnecessary or the frequency of refresh operation can be extremely low. Moreover, stored data can be stored for a long time even when power is not supplied.

Further, in a semiconductor device of the disclosed invention, high voltage is not needed to write data, and deterioration of the element does not become a problem. For example, there is no need to perform injection of electrons to a floating gate and extraction of electrons from the floating gate which are needed in a conventional nonvolatile memory; therefore, deterioration of a gate insulating layer does not occur. In other words, the semiconductor device of the disclosed invention does not have a limit on the number of times of writing operations, which is a problem in a conventional nonvolatile memory, and reliability thereof is drastically improved. Further, data is written by switching an on state and an off state of the transistor, whereby high-speed operation can be easily realized. In addition, there is no need of operation for erasing data.

In addition, because a transistor including a material other than an oxide semiconductor can sufficiently operate at high speed, operation speed of a semiconductor device (e.g., data read operation) can be sufficiently high by combining the transistor including a material other than an oxide semiconductor with a transistor including an oxide semiconductor. Further, a transistor including a material other than an oxide semiconductor makes it possible to realize circuits that need to operate at high speed (e.g., a logic circuit and a driver circuit) preferably.

As described above, a semiconductor device with a novel feature can be realized by including both the transistor including a material other than an oxide semiconductor and the transistor including an oxide semiconductor.

BEST MODE FOR CARRYING OUT THE INVENTION

Figure 1A:
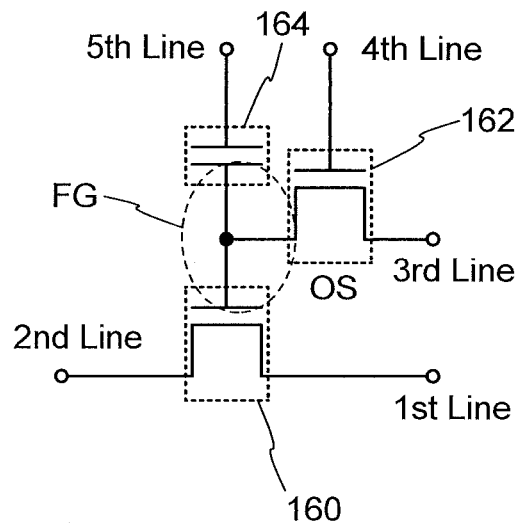
FIGS. 1A and 1B are circuit diagrams of a semiconductor device.

Hereinafter, embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings is not accurately represented in some cases for easy understanding. Therefore, the disclosed invention is not necessarily limited to the position, the size, the range, or the like disclosed in the drawings and the like.

Note that in this specification, ordinal numbers such as "first", "second", and "third" are used in order to avoid confusion among components, and the terms do not mean limitation of the number of components.

[Embodiment 1]

In Embodiment 1, a circuit structure and operation of a semiconductor device of one embodiment of the disclosed invention will be described with reference to FIGS. 1A and 1B. Note that in some circuit structures, "OS" is written beside a transistor in order to indicate that the transistor includes an oxide semiconductor.

In a semiconductor device in FIG. 1A, a first wiring (which is denoted by "1st Line" and also referred to as a source line SL) and a source electrode of a transistor 160 are electrically connected to each other, and a second wiring (which is denoted by "2nd Line" and also referred to as a bit line BL) and a drain electrode of the transistor 160 are electrically connected to each other. A gate electrode of the transistor 160 and one of a source and drain electrodes of the transistor 162 are electrically connected to one of electrodes of a capacitor 164. A third wiring (which is denoted by "3rd Line" and also referred to as a first signal line S1) and the other of the source and drain electrodes of a transistor 162 are electrically connected to each other, and a fourth wiring (which is denoted by "4th Line" and also referred to as a second signal line S2) and a gate electrode of the transistor 162 are electrically connected to each other. A fifth wiring (which is denoted by "5th Line" and also referred to as a word line WL) and the other of the electrodes of the capacitor 164 are electrically connected to each other.

Here, a transistor including an oxide semiconductor is used as the transistor 162. A transistor including an oxide semiconductor has a characteristic of an extremely low off-state current. For that reason, a potential of the gate electrode of the transistor 160 can be held for an extremely long time as long as the transistor 162 is in an off state. Providing the capacitor 164 facilitates holding of charge given to the gate electrode of the transistor 160 and reading of stored data. Note that the transistor 162 including an oxide semiconductor has characteristics of low power consumption and extremely high operation speed because the channel length (L) thereof is 10 nm to 1000 nm inclusive.

The semiconductor device in FIG. 1A utilizes a characteristic with which the potential of the gate electrode of the transistor 160 can be held. With the use of he characteristics, data is written, stored, and read as follows.

First, writing and storing of data will be described. First, the potential of the fourth wiring is made to be a potential at which the transistor 162 is turned on, so that the transistor 162 is turned on. Accordingly, the potential of the third wiring is supplied to the gate electrode of the transistor 160 and the capacitor 164. In other words, predetermined amount of charge is given to the gate electrode of the transistor 160 (writing). Here, one of charges which give two different potential levels (hereinafter, referred to as a Low-level charge and a High-level charge) is given. After that, the potential of the fourth wiring is made to be a potential at which the transistor 162 is turned off, so that the transistor 162 is turned off. Thus, the charge given to the gate electrode of the transistor 160 is held (storing).

Since the off-state current of the transistor 162 is extremely low, the charge of the gate electrode of the transistor 160 is held for a long time.

Second, reading of data will be described. By supplying an appropriate potential (reading potential) to the fifth wiring while a predetermined potential (constant potential) is supplied to the first wiring, the potential of the second wiring varies depending on the amount of charge held in the gate electrode of the transistor 160. In general, when the transistor 160 is an n-channel transistor, an apparent threshold voltage $V_{th\_H}$ when the High-level charge is given to the gate electrode of the transistor 160 is lower than an apparent threshold voltage $V_{th\_L}$ when the Low-level charge is given to the gate electrode of the transistor 160. Here, an apparent threshold voltage refers to the potential of the fifth wiring, which is needed to turn on the transistor 160. Thus, the potential of the fifth wiring is made to be a potential $V_0$ that is intermediate between $V_{th\_H}$ and $V_{th\_L}$, whereby charge given to the gate electrode of the transistor 160 can be determined. For example, in the case where the High-level charge is given in writing data, when the potential of the fifth wiring is made to be $V_0$ ($>V_{th\_H}$), the transistor 160 is turned on. In the case where the Low-level charge is given in writing, even when the potential of the fifth wiring is made to be $V_0$ ($<V_{th\_H}$), the transistor 160 remains in an off state. Therefore, the stored data can be read by measuring the potential of the second wiring.

Note that in the case where memory cells are arrayed to be used, only data of desired memory cells needs to be read. Thus, in order that data of predetermined memory cells may be read and data of the other memory cells may not be read, in the case where the transistors 160 of memory cells are connected in parallel, a potential at which the transistor 160 is turned off regardless of a state of the gate electrode, that is, a potential lower than $V_{th\_H}$, may be applied to the fifth wiring of the memory cell whose data is not to be read. Further, in the case where the transistors 160 of the memory cells are connected in series, a potential which makes the transistor 160 turned on regardless of a state of the gate electrode, that is, a potential higher than $V_{th\_L}$, may be applied to the fifth wiring of the memory cell whose data is not to be read.

Third, rewriting of data will be described. Rewriting of data is performed in a manner similar to that of the writing and storing of data. In other words, the potential of the fourth wiring is made to be a potential at which the transistor 162 is turned on, whereby the transistor 162 is turned on. Accordingly, the potential of the third wiring (potential related to new data) is supplied to the gate electrode of the transistor 160 and the capacitor 164. After that, the potential of the fourth wiring is made to be a potential at which the transistor 162 is turned off, whereby the transistor 162 is turned off. Accordingly, charge related to new data is given to the gate electrode of the transistor 160.

In the semiconductor device of the disclosed invention, data can be directly rewritten by another writing operation in which data is written as described above. Therefore, extraction of charge from a floating gate with the use of a high voltage needed in a flash memory or the like is not necessary and thus, reduction in operation speed, which is attributed to erasing operation, can be suppressed. In other words, high-speed operation of the semiconductor device can be realized.

Note that the source or drain electrode of the transistor 162 is electrically connected to the gate electrode of the transistor 160, thereby having an effect similar to that of a floating gate of a floating gate transistor used for a nonvolatile memory element. Therefore, a portion in the drawing where the source or drain electrode of the transistor 162 is electrically connected to the gate electrode of the transistor 160 is called a floating gate portion FG in some cases. When the transistor 162 is off, the floating gate portion FG can be regarded as being embedded in an insulator and thus charge is held in the floating gate portion FG. The amount of off-state current of the transistor 162 including an oxide semiconductor is lower than or equal to one hundred thousandth of the amount of off-state current of a transistor including silicon or the like; thus, lost of the charge accumulated in the floating gate portion FG due to a leakage current of the transistor 162 is negligible. In other words, with the transistor 162 including an oxide semiconductor, a nonvolatile memory device which can store data without supply of power can be realized.

For example, when the off-state current of the transistor 162 is 10 zA/μm (1 zA (zepto-ampere) is $1\times10^{-21}$ A) or lower at room temperature and the capacitance value of the capacitor 164 is approximately 10 ff, data can be stored for $10^4$ seconds or longer. Needless to say, the storage time varies depending on transistor characteristics and the capacitance value.

Further, in that case, the problem of deterioration of a gate insulating film (tunnel insulating film), which is pointed out in a conventional floating gate transistor, does not exist. That is to say, deterioration of a gate insulating film due to injection of an electron into a floating gate, which has been traditionally regarded as a problem, can be eliminated. This means that there is no limit on the number of times of writing operations in principle. Furthermore, a high voltage needed for writing or erasing data in a conventional floating gate transistor is not necessary.

Figure 1B:
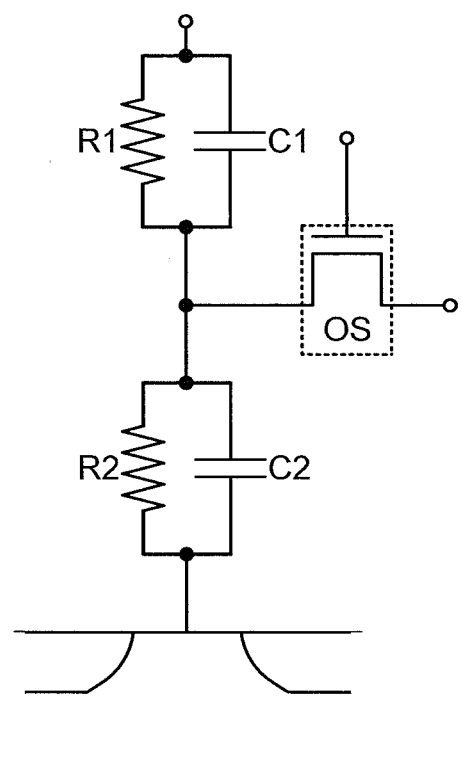

The components such as transistors forming the semiconductor device in FIG. 1A can be regarded as including resistors and capacitors as illustrated in FIG. 1B. In other words, in FIG. 1B, the transistor 160 and the capacitor 164 are each regarded as including a resistor and a capacitor. R1 and C1 denote the resistance value and the capacitance value of the capacitor 164, respectively. The resistance value R1 corresponds to the resistance value which an insulating layer included in the capacitor 164 has. Further, R2 and C2 denote the resistance value and the capacitance value of the transistor 160, respectively. The resistance value R2 corresponds to the resistance value which a gate insulating layer has at the time when the transistor 160 is on. The capacitance value C2 corresponds to a value of so-called gate capacitance (capacitance formed between a gate electrode and a source electrode or a drain electrode, and capacitance formed between the gate electrode and a channel formation region).

An electron holding period (also referred to as a data storage period) is mainly determined by an off-state current of the transistor 162 under the conditions that gate leakage of the transistor 162 is sufficiently small and that when the resistance value (also referred to as effective resistance) between the source electrode and the drain electrode in the case where the transistor 162 is off is ROS, R≥ROS and R2≥ROS are satisfied.

On the other hand, when the conditions are not satisfied, it is difficult to sufficiently secure the holding period even if the off-state current of the transistor 162 is low enough. This is because a leakage current other than the off-state current of the transistor 162 (e.g., a leakage current generated between the source electrode and the gate electrode) is high. Thus, it can be said that the semiconductor device disclosed in this embodiment desirably satisfies the above relation.

It is desirable that C1≥C2 be satisfied. If C1 is large, variation in potential of the fifth wiring can be suppressed when the potential of the floating gate portion FG is controlled by the fifth wiring (e.g., at the time of reading).

When the above relation is satisfied, a more preferable semiconductor device can be realized. Note that R1 and R2 are controlled by the gate insulating layers of the transistor 160 and the transistor 162. The same applies to C1 and C2. Therefore, the material, the thickness, and the like of the gate insulating layer are desirably set as appropriate to satisfy the above relation.

In the semiconductor device described in this embodiment, the floating gate portion FG has an effect similar to a floating gate of a floating gate transistor of a flash memory or the like, but the floating gate portion FG of this embodiment has a feature which is essentially different from that of the floating gate of the flash memory or the like. In the case of a flash memory, since a voltage applied to a control gate is high, it is necessary to keep a proper distance between cells in order to prevent the potential from affecting a floating gate of the adjacent cell. This is one of factors that inhibit higher integration of the semiconductor device. The factor is attributed to a basic principle of a flash memory, in which a tunneling current flows in applying a high electrical field.

Further, because of the above principle of a flash memory, deterioration of an insulating film increases and thus, another problem of the limit on the number of times of rewriting (approximately $10^4$ to $10^5$ times) occurs.

The semiconductor device of the disclosed invention is operated by switching of a transistor including an oxide semiconductor and does not use the above-described principle of charge injection by a tunneling current. In other words, a high electrical field for charge injection is not necessary unlike a flash memory. Accordingly, it is not necessary to consider an influence of a high electrical field from a control gate on an adjacent cell, which facilitates higher integration.

Further, charge injection by a tunneling current is not utilized, which means that there is no cause for deterioration of a memory cell. In other words, the semiconductor device of the disclosed invention has higher durability and reliability than a flash memory.

In addition, it is also advantageous that a high electrical field is unnecessary and a large supplemental circuit (such as a step-up dc-dc converter) is unnecessary as compared to a flash memory.

In the case where the relative dielectric constant $\in$r1 of the insulating layer included in C1 is different from the relative dielectric constant $\in$r2 of the insulating layer included in C2, it is easy to satisfy C1≥C2 while 2·S2≥S1 (desirably, S2≥S1) is satisfied where S1 is the area of C1 and S2 is the area of C2. Specifically, for example, a film formed of a high-k material such as hafnium oxide or a stack of a film formed of a high-k material such as hafnium oxide and a film formed of an oxide semiconductor is used for C1 so that $\in$r1 can be 10 or more, preferably 15 or more, and silicon oxide is used for C2 so that $\in$r2 can be 3 to 4.

Combination of such structures enables higher integration of the semiconductor device of the disclosed invention.

Note that although an n-channel transistor in which electrons are majority carriers is used in the above description, it goes without saying that a p-channel transistor in which holes are majority carriers can be used instead of the n-channel transistor.

As described above, a semiconductor device of an embodiment of the disclosed invention has a nonvolatile memory cell including a writing transistor whose leakage current (off-state current) between a source and a drain is low in an off state, a reading transistor formed of a semiconductor material different from that of the writing transistor, and a capacitor.

The off-state current of the writing transistor is preferably 100 zA ($1 \times 10^{-19}$ A) or lower at temperature at the time when the writing transistor is in use (e.g., 25° C.), more preferably 10 zA ($1 \times 10^{-20}$ A) or lower, still more preferably 1 zA ($1 \times 10^{-21}$ A) or lower. In the case of a transistor including general silicon, it is difficult to achieve a low off-state current as described above. However, in a transistor obtained with the use of an oxide semiconductor processed under an appropriate condition, a low off-state current can be achieved. Therefore, a transistor including an oxide semiconductor is preferably used as the writing transistor.

In addition, a transistor including an oxide semiconductor has a small subthreshold swing (S value), so that the switching rate can be sufficiently high even if mobility is comparatively low. Therefore, by using the transistor as the writing transistor, rising of a writing pulse given to the floating gate portion FG can be extremely sharp. Further, off-state current is low and thus, the amount of charge held in the floating gate portion FG can be reduced. In other words, by using a transistor including an oxide semiconductor, rewriting of data can be performed at high speed.

As for the reading transistor, although there is no limitation on the off-state current, it is desirable to use a transistor which operates at high speed in order to increase the reading speed. For example, a transistor with a switching rate of 1 nano second or lower is preferably used as the reading transistor.

Data is written to the memory cell by turning on the writing transistor so that a potential is supplied to a node where one of a source and drain electrodes of the writing transistor, one of electrodes of the capacitor, and a gate electrode of the reading transistor are electrically connected, and then, turning off the writing transistor so that the predetermined amount of charge is held at the node. Here, the off-state current of the writing transistor is extremely low; thus, the charge supplied to the node is held for a long time. When an off-state current is, for example, substantially 0, refresh operation needed for a conventional DRAM can be unnecessary or the frequency of refresh operation can be significantly low (for example, about once a month or a year). Accordingly, power consumption of a semiconductor device can be sufficiently reduced.

Further, data can be rewritten directly by overwriting of new data to the memory cell. For that reason, erasing operation which is necessary for a flash memory or the like is not needed, so that a reduction in operation speed because of erasing operation can be prevented. In other words, high-speed operation of the semiconductor device can be realized. Moreover, high voltage necessary for a conventional floating gate transistor to write and erase data is unnecessary; thus, power consumption of the semiconductor device can be further reduced. The highest voltage applied to the memory cell according to this embodiment (the difference between the highest potential and the lowest potential applied to respective terminals of the memory cell at the same time) can be 5 V or lower, preferably 3 V or lower, in each memory cell in the case where data of two stages (one bit) is written.

The memory cell provided for the semiconductor device of the disclosed invention is acceptable as long as the writing transistor, the reading transistor, and the capacitor are included therein. In addition, the memory cell can operate even if the area of the capacitor is small. Accordingly, the area of one memory cell can be sufficiently small in comparison with an SRAM which needs six transistors for each of memory cells and the memory cells, and the memory cells can be arranged in the semiconductor device at high density.

In a conventional floating gate transistor, charge travels in a gate insulating film (tunnel insulating film) during writing operation, so that deterioration of the gate insulating film (tunnel insulating film) cannot be avoided. In contrast, in the memory cell according to an embodiment of the present invention, data is written by switching operation of a writing transistor; therefore, deterioration of a gate insulating film, which has been traditionally recognized as a problem, can be eliminated. This means that there is no limit on the number of times of writing operations in principle and writing durability is extremely high. For example, in the memory cell according to one embodiment of the present invention, the current-voltage characteristic is not degraded even after data is written $1 \times 10^9$ or more times (one billion or more times).

Further, in the case of using a transistor including an oxide semiconductor as the writing transistor of the memory cell, the current-voltage characteristic of the memory cell is not degraded even at, for example, a high temperature of 150° C.

because an oxide semiconductor generally has a wide energy gap of 3.0 to 3.5 eV and extremely few thermally excited carriers.

As a result of the intensive research, the present inventors are the first to find that a transistor including an oxide semiconductor has excellent current-voltage characteristic. The current-voltage characteristic is not degraded even at a high temperature of 150° C. and an off-state current as 100 zA or lower which is extremely low. In one embodiment of the disclosed invention, by using such a transistor having the excellent current-voltage characteristic as the writing transistor of the memory cell, a semiconductor device having a novel feature can be provided.

Note that the structures, methods, and the like described in this embodiment can be combined with any of structures, methods, and the like in the other embodiments as appropriate.

[Embodiment 2]

In Embodiment 2, one application example of the semiconductor device described in Embodiment 1 will be explained. Specifically, one example of a semiconductor device in which the semiconductor devices described in Embodiment 1 are arranged in matrix will be explained.

Figure 2:
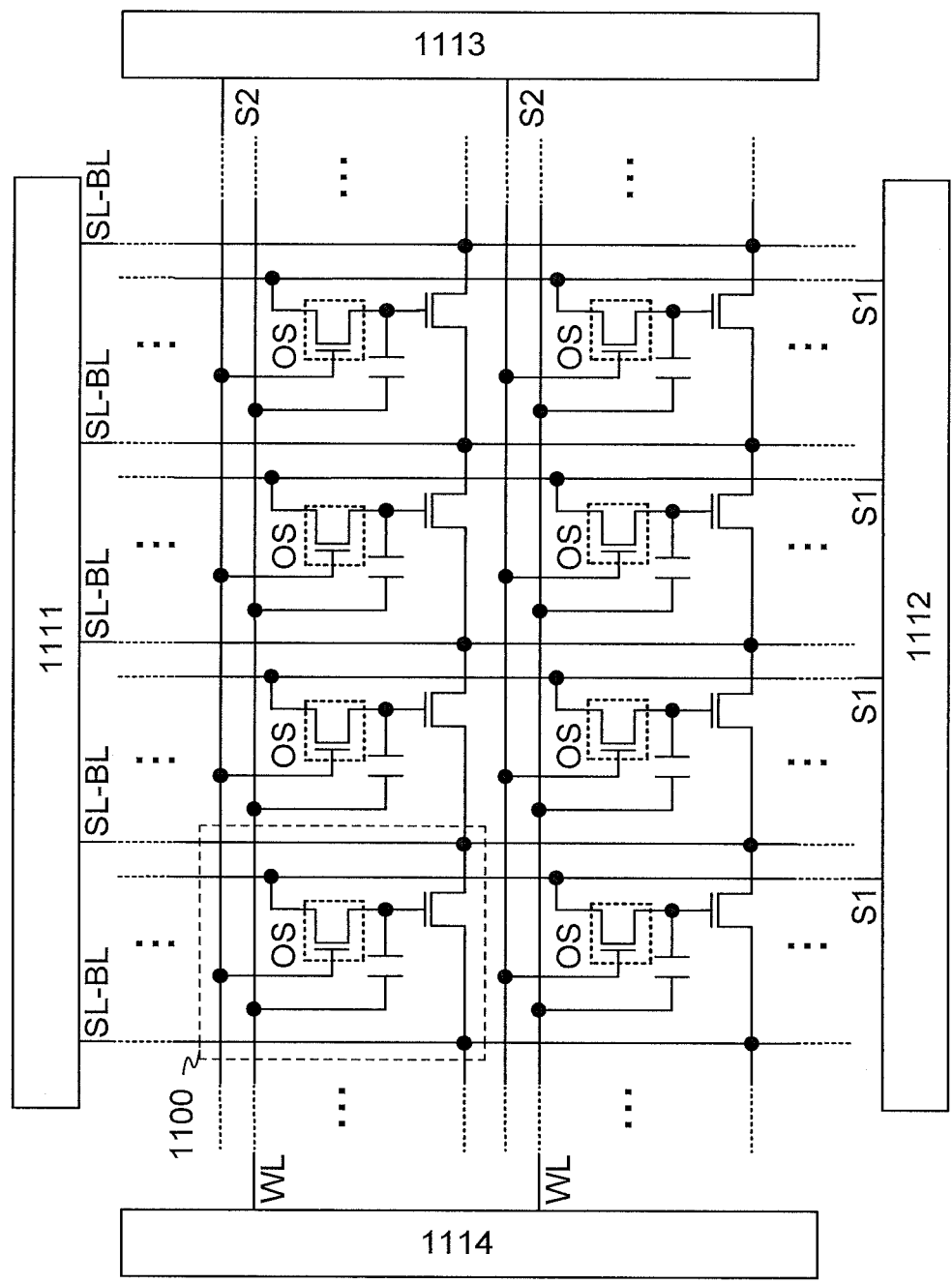
FIG. 2 is a circuit diagram of a semiconductor device.

FIG. 2 illustrates one example of a circuit diagram of a semiconductor device having storage capacity of m×n bits.

The semiconductor device of one embodiment of the present invention includes m word lines WL, m second signal lines S2, (n+1) source-bit lines SL-BL, n first signal lines S1, a memory cell array where a plurality of memory cells 1100 are arranged in matrix of m (rows) (in a vertical direction)×n (columns) (in a horizontal direction) (m and n are natural numbers), and peripheral circuits such as a first driver circuit 1111, a second driver circuit 1112, a third driver circuit 1113, and a fourth driver circuit 1114. Here, the structure described in the foregoing embodiment (e.g., the structure in FIG. 1A) is applied to the memory cell 1100. Note that, although in Embodiment 2, the source-bit lines SL-BL and the first signal lines S1 are provided so as to be extended in a column direction and the word lines WL and the second signal lines S2 are provided so as to be extended in a row direction, as illustrated in FIG. 2, an embodiment of the present invention is not limited to this structure.

Each of the memory cells 1100 includes a first transistor, a second transistor, and a capacitor. A gate electrode of the first transistor, one of a source and drain electrodes of the second transistor, and one of electrodes of the capacitor are connected to one another. The source-bit line SL-BL and a source electrode of the first transistor are connected to each other. A drain electrode of the first transistor and the source-bit line SL-BL that is adjacent to the above source-bit line SL-BL are connected to each other. The first signal line S1 and the other of the source and drain electrodes of the second transistor are connected to each other. The second signal line S2 and a gate electrode of the second transistor are connected to each other. The word line WL and the other of the electrodes of the capacitor are connected to each other.

In other words, the memory cells 1100 are connected in parallel between the source-bit lines SL-BL which are adjacent to each other. For example, the memory cell 1100 of the i-th row and the j-th column (i, j) (i is an integer which is 1 or larger and m or smaller, and j is an integer which is 1 or larger and n or smaller) is connected to the source-bit line SL-BL (j), the source-bit line SL-BL (j+1), the first signal line S1 (j), the word line WL (i), and the second signal line S2 (i).

Here, the source-bit line SL-BL (j) is used in common by the memory cell 1100 (i, j) and the memory cell 1100 (i, j−1), and the source-bit line SL-BL (j+1) is used in common by the memory cell 1100 (i, j+1), and the memory cell 1100 (i, j). In other words, the source-bit line SL-BL functions as a source line of one of the memory cells 1100 which are adjacent to each other in the same row, and a bit line of the other. Note that these functions are not necessarily determined in each the source-bit line SL-BL and the functions can be switched. In addition, the source-bit line SL-BL (1) and the source-bit line SL-BL (n+1) which are provided at ends of the memory cell array are connected to only the memory cell 1100 (i, 1) and the memory cell 1100 (i, n), respectively.

The source-bit lines SL-BL are connected to the first driver circuit 1111. The first signal lines S1 are connected to the second driver circuit 1112. The second signal lines S2 are connected to the third driver circuit 1113. The word lines WL are connected to the fourth driver circuit 1114. Note that here, the first driver circuit 1111, the second driver circuit 1112, the third driver circuit 1113, and the fourth driver circuit 1114 are separately provided; however, the disclosed invention is not limited to this. A driver circuit having any one or some of the functions may alternatively be used.

Figure 3:
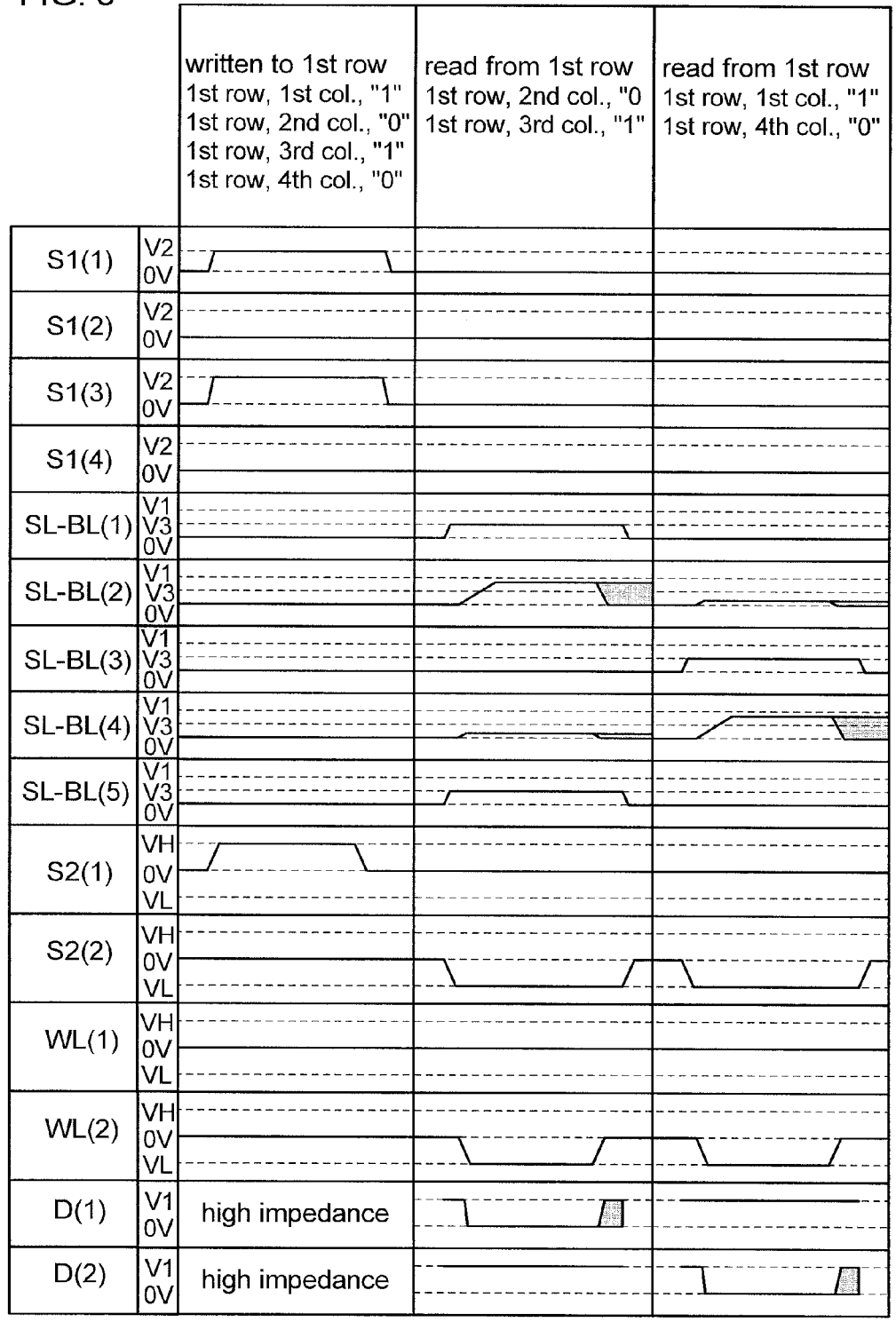
FIG. 3 is a timing diagram.

Next, writing operation and reading operation will be described. FIG. 3 is one example of a timing diagram of the writing operation and the reading operation. Note that in the semiconductor device in Embodiment 2, the writing operation and the reading operation can be performed every row of the memory cell array. Therefore, the semiconductor device in Embodiment 2 can smoothly write and read data.

Note that although the operation of the semiconductor device, which includes a memory cell array including memory cells arranged in two rows and four columns, is described for convenience here, the disclosed invention is not limited to the structure.

The case where data is written to and read from the memory cell 1100 (1, 1), the memory cell 1100 (1, 2), the memory cell 1100 (1, 3), and the memory cell 1100 (1, 4) of the first row will be described. Note that the case where data written to the memory cell (1, 1) is "1", data written to the memory cell (1, 2) is "0", data written to the memory cell (1, 3) is "1", and data written to the memory cell (1, 4) is "0" will be described below.

First, the writing operation will be described. A potential VH is supplied to the second signal line S2 (1) of the first row so that the second transistors of the first row are turned on. Further, a potential 0 V is supplied to the second signal line S2 (2) of the second row so that the second transistors of the second row are turned off.

Further, the first signal line S1 (1) of the first column is supplied with a potential V2, the first signal line S1 (2) of the second column is supplied with the potential 0 V, the first signal line S1 (3) of the third column is supplied with the potential V2, and the first signal line S1 (1) of the fourth column is supplied with the potential 0 V.

As a result, a floating gate portion FG of the memory cell (1, 1) is supplied with the potential V2, a floating gate portion FG of the memory cell (1, 2) is supplied with the potential 0 V, a floating gate portion FG of the memory cell (1, 3) is supplied with the potential V2, and a floating gate portion FG of the memory cell (1, 4) is supplied with the potential 0 V. Here, the potential V2 is higher than the threshold voltage of the first transistors. Then, the potential of the second signal line S2 (1) of the first row is made to be 0 V so that the second transistors in the memory cells of the first row are turned off. Thus, the writing is completed.

Note that the word lines WL (1) and WL (2) are at a potential of 0 V during the writing operation. Further, when the writing is to be completed, the potential of the second signal line S2 (1) of the first row is made to be the potential 0

V before the potential of the first signal line S1 (1) of the first row is changed. After the writing of data, the threshold voltage of a memory cell is Vw0 when data is "0" and Vw1 when data is "1", assuming that a terminal connected to the word line WL is a control gate electrode, the source electrode of the first transistor is a source electrode, and the drain electrode of the first transistor is a drain electrode, in the memory element. Here, the threshold voltage of the memory cell means a voltage of the terminal connected to the word line WL, which changes resistance between the source electrode and the drain electrode of the first transistor. Note that Vw0>0>Vw1 is satisfied here.

Next, the reading operation will be described. In the memory cells of the first row, data in the memory cell (1, 2) and the memory cell (1, 3) is read and then, data in the memory cell (1, 1) and the memory cell (1, 4) is read.

Figure 4:
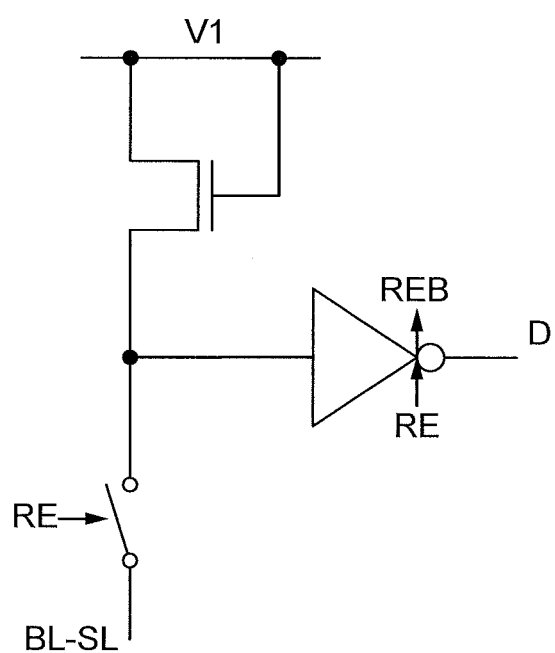
FIG. 4 is a circuit diagram of a semiconductor device.

Note that a reading circuit illustrated in FIG. 4 is electrically connected to each of the source-bit line SL-BL (2) and the source-bit line SL-BL (4). In the reading circuit in FIG. 4, through a switch controlled by a read enable signal (RE signal), the source-bit line SL-BL is connected to a clocked inverter and a transistor which is diode-connected to a wiring supplied with a potential V1.

First, the reading operation of the memory cell (1, 2) and the memory cell (1, 3) will be described.

The word line WL (1) of the first row and the word line WL (2) of the second row are supplied with the potential 0 V and the potential VL, respectively. The potential VL is lower than the threshold voltage Vw1. When the word line WL (1) is at the potential 0 V, in the first row, the first transistor of the memory cell in which data "0" is stored is off, and the first transistor of the memory cell in which data "1" is stored is on. When the word line WL (2) is at the potential VL, in the second row, the first transistors of the memory cells in which either data "0" or data "1" is stored is off.

As a result, resistance between the source-bit lines SL-BL (1) and SL-BL (2) is low because the first transistor of the memory cell (1, 1) is on, resistance between the source-bit lines SL-BL (2) and SL-BL (3) is high because the first transistor of the memory cell (1, 2) is off, resistance between the source-bit lines SL-BL (3) and SL-BL (4) is low because the first transistor of the memory cell (1, 3) is on, and resistance between the source-bit lines SL-BL (4) and SL-BL (5) is high because the first transistor of the memory cell (1, 4) is off.

Then, in order to read data in the memory cell (1, 2) and the memory cell (1, 3), the source-bit line SL-BL (1) is supplied with a potential V3, the source-bit line SL-BL (3) is supplied with the potential 0 V, and the source-bit line SL-BL (5) is supplied with the potential V3. In addition, the read enable signal (RE signal) is asserted (activated).

Here, because resistance between the source-bit lines SL-BL (2) and SL-BL (3) is high, the source-bit line SL-BL (2) is kept at a high potential and data "0" stored in the memory cell (1, 2) is read. Further, because resistance between the source-bit lines SL-BL (3) and SL-BL (4) is low, the source-bit line SL-BL (4) is supplied with a low potential and data "1" stored in the memory cell (1, 3) is read.

However, an output of the reading circuit connected to the source-bit line SL-BL (2) depends on resistance between the source-bit lines SL-BL (1) and SL-BL (2) as well as resistance between the source-bit lines SL-BL (2) and SL-BL (3). If resistance between the source-bit lines SL-BL (1) and SL-BL (2) is high, a difference in resistance between the source-bit lines SL-BL (2) and SL-BL (3) can be read regardless of the potential of the source-bit line SL-BL (1) because the potential of the source-bit line SL-BL (1) affects the reading circuit little. However, if resistance between the source-bit lines SL-BL (1) and SL-BL (2) is low, the potential of the source-bit line SL-BL (1) affects the reading circuit. In addition, similarly, an output of the reading circuit connected to the source-bit line SL-BL (4) depends on resistance between the source-bit lines SL-BL (4) and SL-BL (5) as well as resistance between the source-bit lines SL-BL (3) and SL-BL (4).

For example, when in the case where resistance between the source-bit lines SL-BL (1) and SL-BL (2) is low, the source-bit line SL-BL (1) is supplied with a low potential which is approximately the potential 0 V or lower, the potential of the source-bit line SL-BL (2) is low regardless of resistance between the source-bit lines SL-BL (2) and SL-BL (3). Accordingly, there is a strong tendency for the reading connected to the source-bit line SL-BL (2) to read the data as data "1" although the memory cell (1, 2) stores data "0".

Moreover, when in the case where resistance between the source-bit lines SL-BL (4) and SL-BL (5) is low, the source-bit line SL-BL (5) is supplied with a high potential which is approximately the potential V1 or higher, the potential of the source-bit line SL-BL (4) is high regardless of resistance between the source-bit lines SL-BL (3) and SL-BL (4). Accordingly, there is a strong tendency for the reading connected to the source-bit line SL-BL (4) to read the data as data "0" although the memory cell (1, 3) stores data "1".

In other words, the higher the potentials of the source-bit lines SL-BL (1) and SL-BL (5) are, the more data "0" is likely to be read. The lower the potentials of the source-bit lines SL-BL (1) and SL-BL (5) are, the more data "1" is likely to be read. Accordingly, when the potential V3 supplied to the source-bit lines SL-BL (1) and SL-BL (5) is an appropriate potential between the potential 0 V and the potential V1, an output of the reading circuit can be the same as that in the case where the reading circuit is not connected to the source-bit lines SL-BL (1) and SL-BL (5); therefore, difference in resistance between the memory cell (1, 2) and the memory cell (1, 3) can be correctly read. Specifically, the potential V3 is preferably between the potential 0 V and the potential V1 and may be approximately half of the potential V1, for example.

Through these steps, data stored in the memory cell (1, 2) can be read with the reading circuit connected to the source-bit line SL-BL (2). Similarly, data stored in the memory cell (1, 3) can be read with the reading circuit connected to the source-bit line SL-BL (4).

An output potential in the case where the circuit in FIG. 4 is used as a reading circuit will be described. In Embodiment 2, because resistance between the source-bit lines SL-BL (1) and SL-BL (2) is low and resistance between the source-bit lines SL-BL (2) and SL-BL (3) is high, when the potential V3 is half of the potential V1, a potential higher than the half of the potential V1 is input to the clocked inverter, so that an output D (1) becomes Low. Because resistance between the source-bit lines SL-BL (3) and SL-BL (4) is low and resistance between the source-bit lines SL-BL (4) and SL-BL (5) is high, when the potential V3 is half of the potential V1, a low potential is input to the clocked inverter, so that an output D (2) becomes High.

Note that during the reading operation, the potential 0 V and the potential VL are supplied to the second signal line S2 (1) and the second signal line S2 (2), respectively, so that all the second transistors are turned off. The potential of the floating gate portion FG in the first row is 0 V or V2; thus, the potential of the second signal line S2 (1) is made to be 0 V, whereby all the second transistors in the first row can be turned off. On the other hand, the potential of the floating gate portion FG in the second row is lower than the potential at the time immediately after data writing if the potential VL is supplied to the word line WL (2). Therefore, to prevent the second transistor from being turned on, the potential of the second signal line S2 (2) is made to be a low potential (potential VL) similarly to the potential of the word line WL (2). Thus, all the second transistors can be turned off.

Next, the reading operation of the memory cell (1, 1) and the memory cell (1, 4) will be described.

As in the reading operation of the memory cell (1, 2) and the memory cell (1, 3), the word line WL (1) of the first row and the word line WL (2) of the second row are supplied with the potential 0 V and the potential VL, respectively. The potential VL is lower than the threshold voltage Vwl. When the word line WL (1) is at the potential 0 V, in the first row, the first transistor of the memory cell in which data "0" is stored is off, and the first transistor of the memory cell in which data "1" is stored is on. When the word line WL (2) is at the potential VL, in the second row, the first transistors of the memory cells in which either data "0" or data "1" is stored is off.

As a result, resistance between the source-bit lines SL-BL (1) and SL-BL (2) is low because the first transistor of the memory cell (1, 1) is on, resistance between the source-bit lines SL-BL (2) and SL-BL (3) is high because the first transistor of the memory cell (1, 2) is off, resistance between the source-bit lines SL-BL (3) and SL-BL (4) is low because the first transistor of the memory cell (1, 3) is on, and resistance between the source-bit line SL-BL (4) and SL-BL (5) is high because the first transistor of the memory cell (1, 4) is off.

Then, in order to read data in the memory cell (1, 1) and the memory cell (1, 4), the source-bit line SL-BL (1) is supplied with a potential 0 V, the source-bit line SL-BL (3) is supplied with the potential V3, and the source-bit line SL-BL (5) is supplied with the potential 0 V. In addition, the read enable signal (RE signal) is asserted (activated).

As in the reading operation of the memory cell (1, 2) and the memory cell (1, 3), an output of the reading circuit connected to the source-bit line SL-BL (2) depends on resistance between the source-bit lines SL-BL (2) and SL-BL (3) as well as resistance between the source-bit lines SL-BL (1) and SL-BL (2). In addition, similarly, an output of the reading circuit connected to the source-bit line SL-BL (4) depends on resistance between the source-bit lines SL-BL (3) and SL-BL (4) as well as resistance between the source-bit lines SL-BL (4) and SL-BL (5).

Therefore, as in the reading operation of the memory cell (1, 2) and the memory cell (1, 3), the higher the potential the source-bit line SL-BL (3) is, the stronger a tendency for data "0" to be read becomes. The lower the potential of the source-bit line SL-BL (3) is, the stronger a tendency for data "1" to be read becomes. Accordingly, when the potential V3 supplied for the source-bit line SL-BL (3) is an appropriate potential between the potential 0 V and the potential V1, an output of the reading circuit can be the same even when the reading circuit is not connected to the source-bit line SL-BL (3); therefore, difference between the memory cell (1, 1) and the memory cell (1, 4) in resistance can be correctly read. Specifically, the potential V3 is preferably between the potential 0 V and the potential V1 and may be approximately half of the potential V1, for example.

Through these steps, data stored in the memory cell (1, 1) can be read with the reading circuit connected to the source-bit line SL-BL (2). Similarly, data stored in the memory cell (1, 4) can be read with the reading circuit connected to the source-bit line SL-BL (4).

An output potential in the case where the circuit in FIG. 4 is used as a reading circuit will be described. The potential V3 can be approximately half of the potential V1, for example. In Embodiment 2, because resistance between the source-bit lines SL-BL (1) and SL-BL (2) is low and resistance between the source-bit lines SL-BL (2) and SL-BL (3) is high, when the potential V3 is half of the potential V1, a low potential is input to the clocked inverter, so that an output D (1) becomes High. Because resistance between the source-bit lines SL-BL (3) and SL-BL (4) is low and resistance between the source-bit lines SL-BL (4) and SL-BL (5) is high, when the potential V3 is half of the potential V1, a potential higher than the half of the potential V1 is input to the clocked inverter, so that an output D (2) becomes High.

The operating potentials can be as follows, for example: V1=2 V, V2=1.5 V, V3=1 V, VH=2V, and VL=−2 V are satisfied.

In the semiconductor device with such a structure, one source-bit line SL-BL can function as a source line SL and a bit line BL and the number of wirings of a memory cell can be reduced. Thus, the area occupied by a memory cell can be reduced and the storage capacity per unit area of the semiconductor device can be increased.

An oxide semiconductor device whose off-state current is extremely low is used as the semiconductor device in FIG. 2, so that stored data can be retained for an extremely long time. In other words, power consumption can be adequately reduced because refresh operation becomes unnecessary or the frequency of refresh operation can be extremely low. Moreover, stored data can be stored for a long time even when power is not supplied.

Further, in the semiconductor device in FIG. 2, high voltage is not needed to write data, and deterioration of the element does not become a problem. Therefore, the semiconductor device in FIG. 2 does not have a limit on the number of times of writing operations, which is a problem in a conventional nonvolatile memory, and reliability thereof is drastically improved. Further, data is written by switching an on state and an off state of the transistor, whereby high-speed operation can be easily realized. In addition, there is no need of operation for erasing data.

In addition, because a transistor including a material other than an oxide semiconductor can sufficiently operate at high speed, operation of a semiconductor device (e.g., data read operation) can be sufficiently high by combining the transistor including a material other than an oxide semiconductor with a transistor including an oxide semiconductor. Further, a transistor including a material other than an oxide semiconductor makes it possible to realize circuits that need to operate at high speed (e.g., a logic circuit and a driver circuit) preferably.

In this manner, a semiconductor device with a novel feature can be realized by including both the transistor including a material other than an oxide semiconductor and the transistor including an oxide semiconductor.

The structures, methods, and the like described in this embodiment can be combined as appropriate with any of the structures, methods, and the like described in the other embodiments.

[Embodiment 3]

In Embodiment 3, another example of a semiconductor device in which the semiconductor devices described in Embodiment 1 are arranged in matrix will be explained. Hereinafter, portions different from those in the foregoing embodiments will be described and a detailed description of portions similar to those in the foregoing embodiments is omitted.

Figure 5:
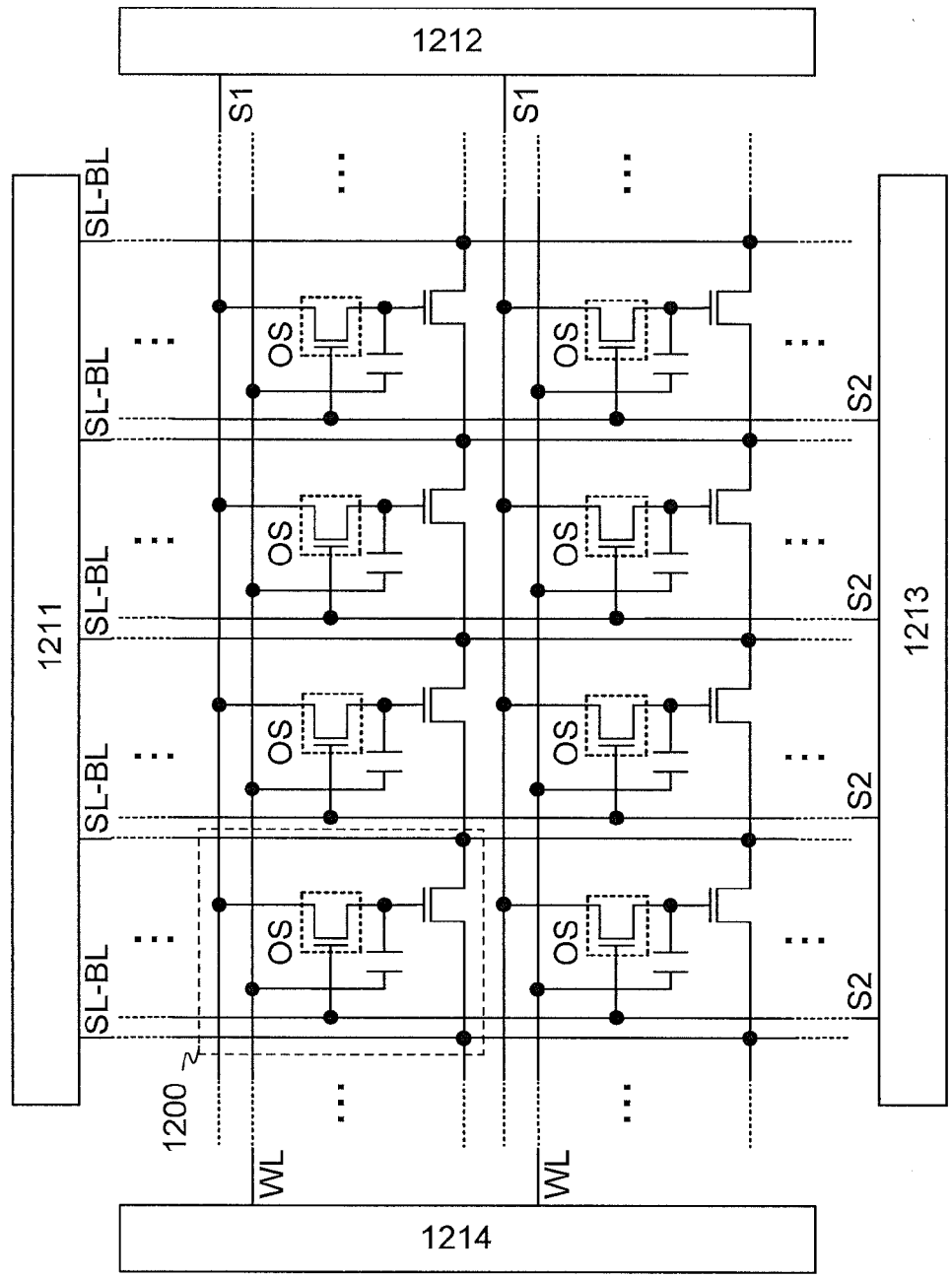
FIG. 5 is a circuit diagram of a semiconductor device.

FIG. 5 illustrates one example of a circuit diagram of a semiconductor device having storage capacity of m×n bits. In Embodiment 3, unlike Embodiment 2, an example will be described in which the second signal lines S2 are provided so as to be extended in a column direction and the first signal lines S1 are provided so as to be extended in a row direction.

The semiconductor device of one embodiment of the present invention includes m word lines WL, m first signal lines S1, (n+1) source-bit lines SL-BL, n second signal lines S2, a memory cell array where a plurality of memory cells 1200 are arranged in matrix of m (rows) (in a vertical direction)×n (columns) (in a horizontal direction) (m and n are natural numbers), and peripheral circuits such as a first driver circuit 1211, a second driver circuit 1212, a third driver circuit 1213, and a fourth driver circuit 1214. Here, the structure described in the foregoing embodiment (e.g., the structure in FIG. 1A) is applied to the memory cell 1200. Note that, in Embodiment 3, the source-bit lines SL-BL and the second signal lines S2 are provided so as to be extended in a column direction and the word lines WL and the first signal lines S1 are provided so as to be extended in a row direction, unlike Embodiment 2.

Each of the memory cells 1200 includes a first transistor, a second transistor, and a capacitor. A gate electrode of the first transistor, one of a source and drain electrodes of the second transistor, and one of electrodes of the capacitor are connected to one another. The source-bit line SL-BL and a source electrode of the first transistor are connected to each other. A drain electrode of the first transistor and the source-bit line SL-BL that is adjacent to the above source-bit line SL-BL are connected to each other. The first signal line S1 and the other of the source and drain electrodes of the second transistor are connected to each other. The second signal line S2 and a gate electrode of the second transistor are connected to each other. The word line WL and the other of the electrodes of the capacitor are connected to each other.

In other words, the memory cells 1200 are connected in parallel between the source-bit lines SL-BL which are adjacent to each other. For example, the memory cell 1200 of an i-th row and a j-th column (i, j) (i is an integer which is 1 or larger and m or smaller, and j is an integer which is 1 or larger and n or smaller) is connected to the source-bit line SL-BL (j), the source-bit line SL-BL (j+1), the second signal line S2 (j), the word line WL (i), and the first signal lines S1 (i).

Here, the source-bit line SL-BL (j) is used in common by the memory cell 1100 (i, j) and the memory cell 1200 (i, j−1), and the source-bit line SL-BL (j+1) is used in common by the memory cell 1200 (i, j+1) and the memory cell 1200 (i, j). In other words, the source-bit line SL-BL functions as a source line of one of the memory cells 1200 which are adjacent to each other in the same row, and a bit line of the other. Note that these functions are not necessarily determined in each the source-bit line SL-BL and the functions can be switched. In addition, the source-bit line SL-BL (1) and the source-bit line SL-BL (n+1) which are provided at ends of the memory cell array are connected to only the memory cell 1200 (i, 1) and the memory cell 1200 (i, n).

The source-bit lines SL-BL are connected to the first driver circuit 1211. The first signal lines S1 are connected to the second driver circuit 1212. The second signal lines S2 are connected to the third driver circuit 1213. The word lines WL are connected to the fourth driver circuit 1214. Note that here, the first driver circuit 1211, the second driver circuit 1212, the third driver circuit 1213, and the fourth driver circuit 1214 are separately provided; however, the disclosed invention is not limited to this. A driver circuit having any one or some of the functions may alternatively be used.

The writing operation and the reading operation of the semiconductor device in Embodiment 3 are similar to those of the semiconductor device in Embodiment 2; therefore, the description in Embodiment 2 is to be referred to.

Note that because the second signal lines S2 are provided in a column direction in the semiconductor device in Embodiment 3, the writing operation is performed in every row of the memory cell array. In the writing operation, potentials are supplied to the first signal line S1 and the word line WL so that a voltage between a gate electrode and a source electrode of a second transistor of the memory cell and a voltage between the gate electrode of a drain electrode of the second transistor of the memory cell are approximately the same, whereby data can be selectively written to a memory cell in a column in which data writing is performed. Therefore, in the semiconductor device in Embodiment 3, bitwise data can be written.

In the semiconductor device with such a structure, one source-bit line SL-BL can function as a source line SL and a bit line BL and the number of wirings of a memory cell can be reduced. Thus, the area occupied by a memory cell can be reduced and the storage capacity per unit area of the semiconductor device can be increased.

As in Embodiment 2, an oxide semiconductor device whose off-state current is extremely low is used as the semiconductor device in FIG. 5, so that stored data can be retained for an extremely long time. In other words, power consumption can be adequately reduced because refresh operation becomes unnecessary or the frequency of refresh operation can be extremely low. Moreover, stored data can be stored for a long time even when power is not supplied.

Further, as in Embodiment 2, in the semiconductor device in FIG. 2, high voltage is not needed to write data, and deterioration of the element does not become a problem. Therefore, the semiconductor device in FIG. 2 does not have a limit on the number of times of writing operations, which is a problem in a conventional nonvolatile memory, and reliability thereof is drastically improved. Further, data is written by switching an on state and an off state of the transistor, whereby high-speed operation can be easily realized. In addition, there is no need of operation for erasing data.

In addition, because a transistor including a material other than an oxide semiconductor can sufficiently operate at high speed, operation of a semiconductor device (e.g., data read operation) can be sufficiently high by combining the transistor including a material other than an oxide semiconductor with a transistor including an oxide semiconductor. Further, a transistor including a material other than an oxide semiconductor makes it possible to realize circuits that need to operate at high speed (e.g., a logic circuit and a driver circuit) preferably.

In this manner, a semiconductor device with a novel feature can be realized by including both the transistor including a material other than an oxide semiconductor and the transistor including an oxide semiconductor.

The structures, methods, and the like described in this embodiment can be combined as appropriate with any of the structures, methods, and the like described in the other embodiments.

[Embodiment 4]

In this embodiment, a structure and a manufacturing method of a semiconductor device of one embodiment of the disclosed invention will be described with reference to FIGS. 6A and 6B, FIGS. 7A to 7H, and FIGS. 8A to 8E.

<Cross-sectional Structure and Planar Structure of Semiconductor Device>

Figure 6A:
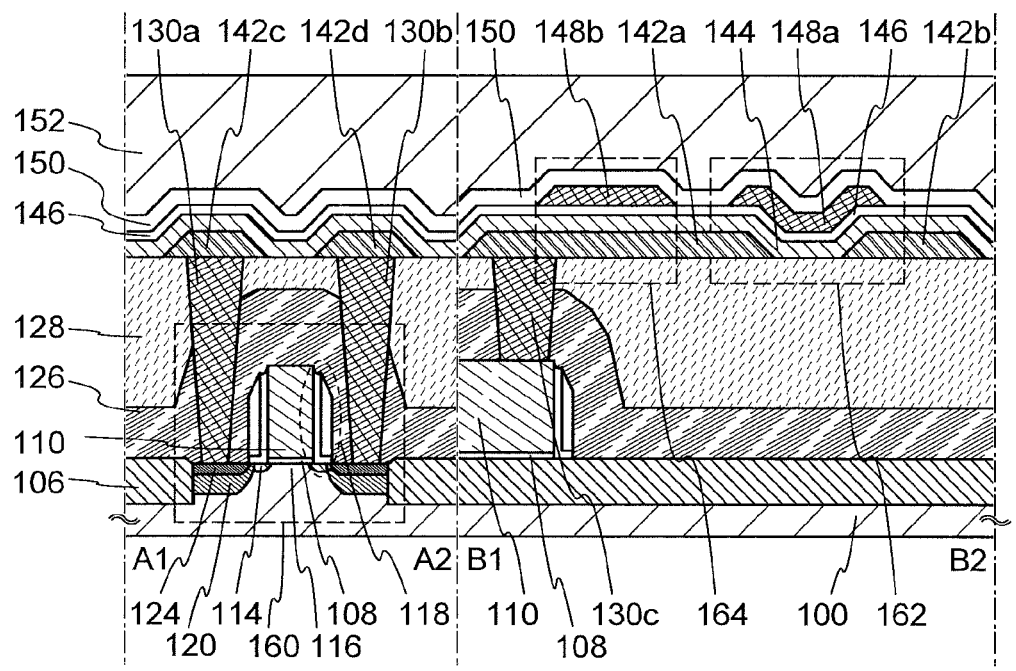
FIGS. 6A and 6B are a cross-sectional view and a plan view of a semiconductor device.
Figure 6B:
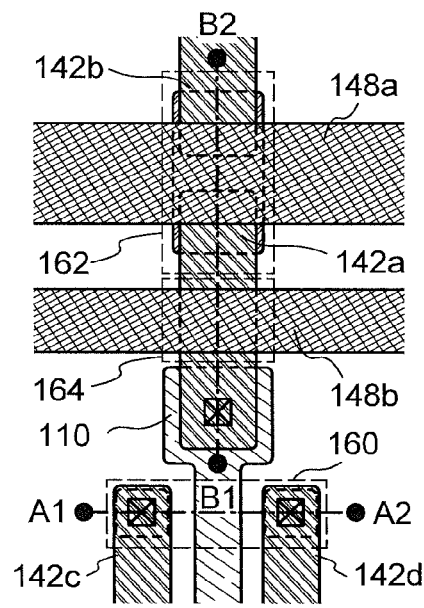

FIGS. 6A and 6B illustrate one example of a structure of the semiconductor device. FIG. 6A illustrates a cross section of the semiconductor device, and FIG. 6B illustrates a plan view of the semiconductor device. Here, FIG. 6A corresponds to a cross-section taken along line A1-A2 and line B1-B2 of FIG. 6B. The semiconductor device illustrated in FIGS. 6A and 6B includes, in a lower portion, the transistor 160 using a material other than an oxide semiconductor, and in an upper portion, the transistor 162 using an oxide semiconductor. A transistor formed using a semiconductor material other than an oxide semiconductor easily operates at high speed. On the other hand, a transistor including an oxide semiconductor can hold charge for a long time owing to its characteristics.

Note that although all the transistors are n-channel transistors here, it goes without saying that p-channel transistors can be used. In addition, because the technical nature of the disclosed invention is to use an oxide semiconductor in the transistor 162 so that data can be stored, it is not necessary to limit a specific structure of a semiconductor device to the structure described here.

The transistor 160 in each of FIGS. 6A and 6B includes a channel formation region 116 in a substrate 100 containing a semiconductor material (for example, silicon); impurity regions 114 and high-concentration regions 120, a combination of the impurity regions 114 and the high-concentration regions 120 can simply be referred to as impurity regions, impurity regions between which is provided the channel formation region 116; a gate insulating layer 108 over the channel formation region 116; a gate electrode 110 over the gate insulating layer 108; a source or drain electrode 130a electrically connected to an impurity region; and a source or drain electrode 130b electrically connected to a second impurity region 114.

A sidewall insulating layers 118 are provided on side surfaces of the gate electrode 110. Moreover, when seen from a direction perpendicular to a surface of the substrate 100, the high-concentration impurity regions 120 are formed in a region of the substrate 100 which does not overlap with the sidewall insulating layers 118, and metal compound regions 124 are present in contact with the high-concentration impurity regions 120. In addition, an element isolation insulating layer 106 is provided over the substrate 100 so as to surround the transistor 160. An interlayer insulating layer 126 and an interlayer insulating layer 128 are provided so as to cover the transistor 160. The source or drain electrode 130a and the source or drain electrode 130b are electrically connected to the metal compound regions 124 through openings formed in the interlayer insulating layers 126 and 128. That is, the source or drain electrode 130a and the source or drain electrode 130b are electrically connected to the high-concentration impurity regions 120 and the impurity regions 114 through the metal compound regions 124. In addition, an electrode 130c is electrically connected to the gate electrode 110 through an opening formed in the interlayer insulating layers 126 and 128. Note that the sidewall insulating layers 118 are not formed in some cases, for integration of the transistor 160.

The transistor 162 in each of FIG. 6A and FIG. 6B includes a source or drain electrode 142a and a source or drain electrode 142b which are provided over an interlayer insulating layer 128, an oxide semiconductor layer 144 electrically connected to the source or drain electrode 142a and the source or drain electrode 142b, a gate insulating layer 146 covering the source or drain electrode 142a, the source or drain electrode 142b, and the oxide semiconductor layer 144, and a gate electrode 148a provided over the gate insulating layer 146 so as to overlap with the oxide semiconductor layer 144.

Here, the oxide semiconductor layer 144 is preferably an oxide semiconductor layer which is highly purified by sufficiently removing impurity such as hydrogen therefrom or by supplying a sufficient amount of oxygen thereto. Specifically, the hydrogen concentration of the oxide semiconductor layer 144 is $5\times10^{19}$ atoms/cm$^3$ or lower, preferably $5\times10^{18}$ atoms/cm$^3$ or lower, more preferably $5\times10^{17}$ atoms/cm$^3$ or lower. Note that the hydrogen concentration of the oxide semiconductor layer 144 is measured by secondary ion mass spectrometry (SIMS).

In the oxide semiconductor layer 144 which is highly purified by sufficiently reducing the hydrogen concentration therein and in which a defect level in an energy gap due to oxygen deficiency is reduced by supplying a sufficient amount of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (per unit channel width (1 μm), here) of the transistor 162 at room temperature is 100 zA/μm (1 zA (zepto-ampere) is $1\times10^{-21}$ A) or lower, preferably 10 zA/μm or lower. The transistor 162 with significantly excellent off-state current characteristics can be obtained with the use of such an oxide semiconductor which is made to be an i-type (intrinsic) oxide semiconductor or a substantially i-type oxide semiconductor.

Note that since the oxide semiconductor layer 144 is not patterned to have an island shape in the transistor 162 in FIG. 6A, the oxide semiconductor layer 144 is prevented from being contaminated by etching for patterning.

The capacitor 164 includes the source or drain electrode 142a, the oxide semiconductor layer 144, the gate insulating layer 146, and an electrode 148b. That is, the source or drain electrode 142a functions as one electrode of the capacitor 164 and the electrode 148b functions as the other electrode of the capacitor 164.

Note that in the capacitor 164 illustrated in FIG. 6A, insulating properties between the source or drain electrode 142a and the electrode 148b can be adequately secured by stacking the oxide semiconductor layer 144 and the gate insulating layer 146.

Note that in the transistor 162 and the capacitor 164, edge portions of the source or drain electrode 142a and the source or drain electrode 142b are preferably tapered. Here, a taper angle is, for example, 30° to 60° inclusive. Note that the "taper angle" means an inclination angle formed by a side surface and a bottom surface of a layer (for example, the source or drain electrode 142a) having a tapered shape when being observed in a direction perpendicular to the cross-section (a plane which is perpendicular to the surface of the substrate). When the edge portions of the source or drain electrode 142a and the source or drain electrode 142b are tapered, the coverage of the oxide semiconductor layer 144 can be improved and disconnection can be prevented.

Further, an interlayer insulating layer 150 is provided over the transistor 162 and the capacitor 164 and an interlayer insulating layer 152 is provided over the interlayer insulating layer 150.

<Method for Manufacturing Semiconductor Device>

Next, an example of a method for manufacturing the semiconductor device will be described below. First, a method for manufacturing the transistor 160 in the lower portion will be described below with reference to FIGS. 7A to 7H, and then a method for manufacturing the transistor 162 in the upper portion will be described with reference to FIGS. 8A to 8E.

<Method for Manufacturing Transistor in Lower Portion>

Figure 7A:
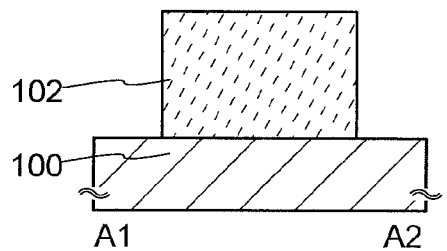
FIGS. 7A to 7H are cross-sectional views relating to a manufacturing process of a semiconductor device.
Figure 7E:
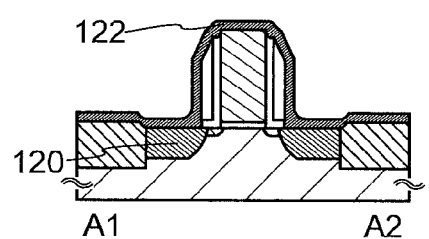

First, the substrate 100 including a semiconductor material is prepared (see FIG. 7A). As the substrate 100 including a semiconductor material, a single crystal semiconductor substrate or a polycrystalline semiconductor substrate including silicon, silicon carbide, or the like; a compound semiconductor substrate including silicon germanium or the like; an SOI substrate; or the like can be used. Here, an example of using a single crystal silicon substrate as the substrate 100 including a semiconductor material will be described. Note that in general, the term "SOI substrate" means a substrate where a silicon layer is provided on an insulating surface. In this specification and the like, the term "SOI substrate" also includes a substrate where a semiconductor layer formed using a material other than silicon is provided over an insulating surface in its category. That is, a semiconductor layer included in the "SOI substrate" is not limited to a silicon layer. Moreover, the SOI substrate can be a substrate having a structure in which a semiconductor layer is provided over an insulating substrate such as a glass substrate with an insulating layer provided therebetween.

In particular, a single crystal semiconductor substrate including silicon, for example, is used as the substrate 100 including a semiconductor material, so that the semiconductor device in Embodiment 2 or 3 can read data at higher speed.

A protective layer 102 serving as a mask for forming an element isolation insulating layer is formed over the substrate 100 (see FIG. 7A). As the protective layer 102, an insulating layer formed using silicon oxide, silicon nitride, silicon nitride oxide, silicon oxynitride or the like can be used, for example. Note that before or after this step, an impurity element imparting n-type conductivity or an impurity element imparting p-type conductivity may be added to the substrate 100 in order to control the threshold voltage of the transistor. When the semiconductor is formed using silicon, phosphorus, arsenic, or the like can be used as the impurity imparting n-type conductivity. Boron, aluminum, gallium, or the like can be used as the impurity imparting p-type conductivity.

Next, part of the substrate 100 in a region that is not covered with the protective layer 102 (i.e., an exposed region) is removed by etching with the use of the protective layer 102 as a mask. Thus, a semiconductor region 104 which is separated from another semiconductor region is formed (see FIG. 7B). As the etching, dry etching is preferably employed, but wet etching may be performed. An etching gas and an etchant can be selected as appropriate depending on a material of a layer to be etched.

Figure 7B:
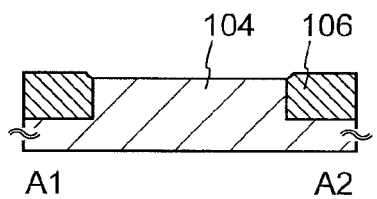
Figure 7F:
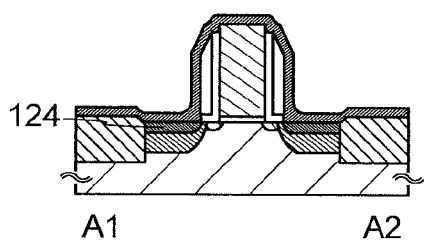

Then, an insulating layer is formed so as to cover the semiconductor region 104, and the insulating layer in a region overlapping with the semiconductor region 104 is selectively removed, so that the element isolation insulating layer 106 is formed (see FIG. 7B). The insulating layer is formed using silicon oxide, silicon nitride, silicon oxynitride, or the like. As a method for removing the insulating layer, any of etching treatment and polishing treatment such as CMP can be employed. Note that the protective layer 102 is removed after the formation of the semiconductor region 104 or after the formation of the element isolation insulating layer 106.

Next, an insulating layer is formed over the semiconductor region 104, and a layer containing a conductive material is formed over the insulating layer.

The insulating layer is to be a gate insulating layer later and preferably has a single-layer structure or a layered structure using a film containing silicon oxide, silicon oxynitride, silicon nitride, hafnium oxide, aluminum oxide, tantalum oxide, yttrium oxide, hafnium silicate ($HfSi_xO_y$, ($x>0$, $y>0$)), hafnium silicate to which nitrogen is added ($HfSi_xO_yN_z$ ($x>0$, $y>0$, $z>0$)), hafnium aluminate to which nitrogen is added ($HfAl_xO_yN_z$, ($x>0$, $y>0$, $z>0$)), or the like which is obtained by a CVD method, sputtering, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe, oxygen, nitrogen oxide, ammonia, nitrogen, or hydrogen. The thickness of the insulating layer can be, for example, 1 nm to 100 nm, preferably 10 nm to 50 nm.

The layer containing a conductive material can be formed using a metal material such as aluminum, copper, titanium, tantalum, or tungsten. The layer containing a conductive material may be formed using a semiconductor material such as polycrystalline silicon. There is no particular limitation on the method for forming the layer containing a conductive material, and a variety of film formation methods such as an evaporation method, a CVD method, sputtering, and a spin coating method can be employed. Note that this embodiment describes an example of the case where the layer containing a conductive material is formed using a metal material.

Figure 7C:
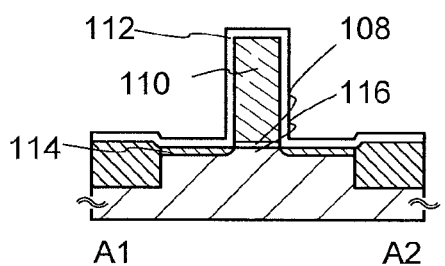

After that, the insulating layer and the layer containing a conductive material are selectively etched, so that the gate insulating layer 108 and the gate electrode 110 are formed (see FIG. 7C).

Next, an insulating layer 112 that covers the gate electrode 110 is formed (see FIG. 7C). Then, impurity regions 114 with shallow junction depths are formed by adding phosphorus (P), arsenic (As), or the like to the semiconductor region 104 (see FIG. 7C). Note that phosphorus or arsenic is added here in order to form an n-channel transistor; an impurity element such as boron (B) or aluminum (Al) may be added in the case of forming a p-channel transistor. With the formation of the impurity regions 114, the channel formation region 116 is formed in the semiconductor region 104 below the gate insulating layer 108 (see FIG. 7C). Here, the concentration of the added impurity can be set as appropriate; the concentration is preferably increased when a semiconductor element is highly miniaturized. The step in which the impurity regions 114 are formed after the formation of the insulating layer 112 is employed here; alternatively, the insulating layer 112 may be formed after the formation of the impurity regions 114.

Figure 7G:
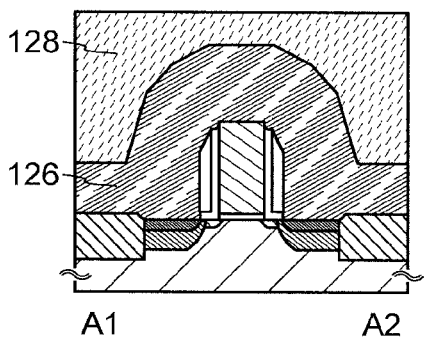
Figure 7D:
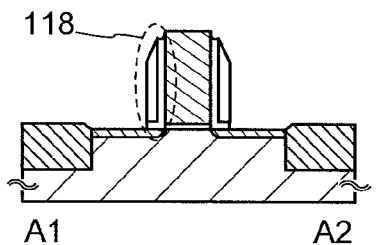

Next, the sidewall insulating layers 118 are formed (see FIG. 7D). An insulating layer is formed so as to cover the insulating layer 112 and then subjected to highly anisotropic etching, whereby the sidewall insulating layers 118 can be formed in a self-aligned manner. At this time, it is preferable to partly etch the insulating layer 112 so that a top surface of the gate electrode 110 and top surfaces of the impurity regions 114 are exposed. Note that the sidewall insulating layers 118 are not provided in some cases so that higher integration or the like are realized.

Then, an insulating layer is formed so as to cover the gate electrode 110, the impurity regions 114, the sidewall insulating layers 118, and the like. Next, phosphorus (P), arsenic (As), or the like is added to regions which are in contact with the impurity regions 114, so that the high-concentration impurity regions 120 are formed (see FIG. 7E). After that, the insulating layer is removed, and a metal layer 122 is formed so as to cover the gate electrode 110, the sidewall insulating layers 118, the high-concentration impurity regions 120, and the like (see FIG. 7E). A variety of film formation methods such as a vacuum evaporation method, sputtering, and a spin coating method can be employed for forming the metal layer 122. The metal layer 122 is preferably formed using a metal material that reacts with a semiconductor material contained in the semiconductor region 104 to be a low-resistance metal compound. Examples of such a metal material are titanium, tantalum, tungsten, nickel, cobalt, and platinum.

Next, heat treatment is performed so that the metal layer 122 reacts with the semiconductor material. Thus, the metal compound regions 124 that are in contact with the high-concentration impurity regions 120 are formed (see FIG. 7F). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it goes without saying that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can sufficiently reduce the electric resistance and improve element characteristics. Note that the metal layer 122 is removed after the metal compound regions 124 are formed.

Then, the interlayer insulating layer 126 and the interlayer insulating layer 128 are formed so as to cover the components formed in the above steps (see FIG. 7G). The interlayer insulating layers 126 and 128 can be formed using a material containing an inorganic insulating material such as silicon oxide, silicon oxynitride, silicon nitride, hafnium oxide, aluminum oxide, or tantalum oxide. Moreover, the interlayer insulating layers 126 and 128 can be formed using an organic insulating material such as polyimide or an acrylic resin. Note that although a layered structure of the interlayer insulating layer 126 and the interlayer insulating layer 128 is employed here, one embodiment of the disclosed invention is not limited thereto. A single-layer structure or a layered structure including two or more layers can also be used. After the formation of the interlayer insulating layer 128, a surface of the interlayer insulating layer 128 is preferably planarized by CMP, etching, or the like.

Figure 7H:
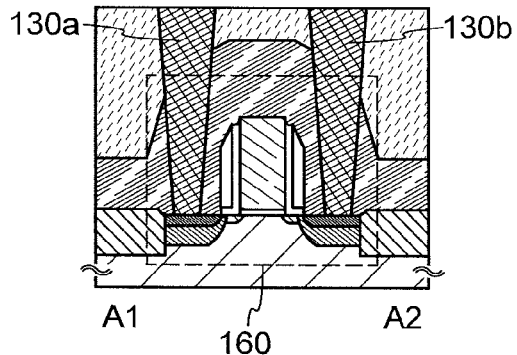

Then, openings that reach the metal compound regions 124 are formed in the interlayer insulating layers, and the source or drain electrode 130a and the source or drain electrode 130b are formed in the openings (see FIG. 7H). The source or drain electrode 130a and the source or drain electrode 130b can be formed in such a manner, for example, that a conductive layer is formed in a region including the openings by a PVD method, a CVD method, or the like and then part of the conductive layer is removed by etching, CMP, or the like.

Specifically, it is possible to employ a method, for example, in which a thin titanium film is formed in a region including the openings by a PVD method and a thin titanium nitride film is formed by a CVD method, and then, a tungsten film is formed so as to be embedded in the openings. Here, the titanium film formed by a PVD method has a function of reducing an oxide film (e.g., a natural oxide film) formed on a surface over which the titanium film is formed, to decrease the contact resistance with the lower electrode (the metal compound region 124, here), or the like. The titanium nitride film formed after the formation of the titanium film has a barrier function of preventing diffusion of the conductive material. A copper film may be formed by a plating method after the formation of the barrier film of titanium, titanium nitride, or the like.

Note that in the case where the source or drain electrode 130a and the source or drain electrode 130b are formed by removing part of the conductive layer, the step is preferably performed so that the surfaces are planarized. For example, when a thin titanium film and a thin titanium nitride film are formed in a region including the openings and then a tungsten film is formed so as to be embedded in the openings, an excess tungsten film, an excess titanium film, an excess titanium nitride film, or the like is removed and the planarity of the surface can be improved by subsequent CMP. The surface including the source or drain electrode 130a and the source or drain electrode 130b is planarized in such a manner, so that an electrode, a wiring, an insulating layer, a semiconductor layer, and the like can be favorably formed in later steps.

Note that only the source or drain electrode 130a and the source or drain electrode 130b which are in contact with the metal compound regions 124 are shown here; however, an electrode that is in contact with the gate electrode 110, and the like can also be formed in this step. There is no particular limitation on a material used for the source or drain electrode 130a and the source or drain electrode 130b, and a variety of conductive materials can be used. For example, a conductive material such as molybdenum, titanium, chromium, tantalum, tungsten, aluminum, copper, neodymium, or scandium can be used. In view of heat treatment performed later, it is preferable that the source or drain electrode 130a and the source or drain electrode 130b be formed using a material having heat resistance high enough to withstand the heat treatment.

Through the above steps, the transistor 160 using the substrate 100 containing a semiconductor material is formed (see FIG. 7H). The transistor 160 including a material other than an oxide semiconductor can operate at high speed.

Note that an electrode, a wiring, an insulating layer, or the like may be further formed after the above steps. When a wiring has a multi-layer structure including a layered structure of an interlayer insulating layer and a conductive layer, a highly integrated semiconductor device can be provided.

<Method for Manufacturing Transistor in Upper Portion>

Next, steps for manufacturing the transistor 162 over the interlayer insulating layer 128 will be described with reference to FIGS. 8A to 8E. Note that the transistor 160 and the like below the transistor 162 are omitted in FIGS. 8A to 8E, which illustrate a manufacturing process of the transistor 162, a variety of electrodes over the interlayer insulating layer 128, and the like.

Figure 8A:
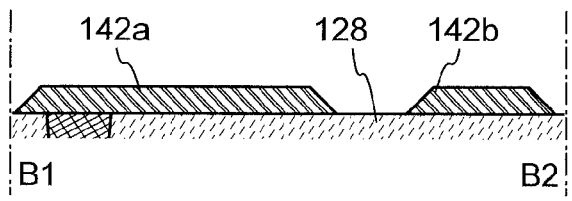
FIGS. 8A to 8E are cross-sectional views relating to a manufacturing process of a semiconductor device.

First, a conductive layer is formed over the interlayer insulating layer 128 and is selectively etched, so that the source or drain electrode 142a and the source or drain electrode 142b are formed (see FIG. 8A).

The conductive layer can be formed by a PVD method such as sputtering, or a CVD method such as a plasma CVD method. As a material for the conductive layer, an element selected from aluminum, chromium, copper, tantalum, titanium, molybdenum, or tungsten; an alloy containing any of these elements as a component; or the like can be used. Moreover, one or more materials selected from manganese, magnesium, zirconium, and beryllium may be used. Alternatively, aluminum combined with one or more of elements selected from titanium, tantalum, tungsten, molybdenum, chromium, neodymium, and scandium may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

Alternatively, the conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer is preferably etched so that edge portions of the source or drain electrode 142a and the source or drain electrode 142b are tapered. Here, a taper angle is preferably 30° to 60° inclusive, for example. When the edge portions of the source or drain electrode 142a and the source or drain electrode 142b are etched so as to be tapered, the coverage of the gate insulating layer 146 to be formed later is improved and disconnection can be prevented.

The channel length (L) of the transistor is determined by a distance between a lower edge portion of the source or drain electrode 142a and a lower edge portion of the source or drain electrode 142b. Note that in the case where the channel length (L) of the transistor is 25 nm or lower, light exposure for forming a mask is preferably performed with extreme ultraviolet rays whose wavelength is short of several nanometers to several tens of nanometers. The resolution of light exposure with extreme ultraviolet rays is high and the depth of focus is large. For these reasons, the channel length (L) of the transistor to be formed later can be in the range of 10 nm to 1000 nm (1 μm), and the circuit can operate at higher speed. Moreover, miniaturization can lead to low power consumption of a semiconductor device.

Note that an insulating layer serving as a base may be formed over the interlayer insulating layer 128. The insulating layer can be formed by a PVD method, a CVD method, or the like.

Further, an insulating layer may be formed over the source or drain electrode 142a and the source or drain electrode 142b. By providing the insulating layer, parasitic capacitance formed between a gate electrode to be formed later and the source or drain electrode 142a and between the gate electrode and the source or drain electrode 142b can be reduced.

Figure 8B:
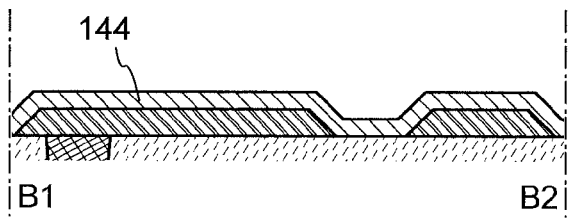

Next, the oxide semiconductor layer 144 is formed so as to cover the source or drain electrode 142a and the source or drain electrode 142b (see FIG. 8B).

The oxide semiconductor layer 144 can be formed using any of the following oxide semiconductors: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor; or a one-component metal oxide such as an In—O-based oxide semiconductor, a Sn—O-based oxide semiconductor, or a Zn—O-based oxide semiconductor.

In particular, an In—Ga—Zn—O-based oxide semiconductor material has sufficiently high resistance when there is no electric field and thus off-state current can be sufficiently reduced. In addition, with high field-effect mobility, the In—Ga—Zn—O-based oxide semiconductor material is suitable for a semiconductor material used in a semiconductor device.

As a typical example of the In—Ga—Zn—O-based oxide semiconductor material, one represented by $InGaO_3(ZnO)_m$ (m>0 and m is not a natural number) is given, and it can be confirmed using analysis with ICP-MS or RBS that m is not a natural number. Using M instead of Ga, there is an oxide semiconductor material expressed by $InMO_3(ZnO)_m$ (m>0 and m is not a natural number). Here, M denotes one or more of metal elements selected from gallium (Ga), aluminum (Al), iron (Fe), nickel (Ni), manganese (Mn), cobalt (Co), and the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are only examples.

As a target for forming the oxide semiconductor layer 144 by sputtering, a target having a composition ratio of In:Ga:Zn=1:x:y (x is 0 or more and y is 0.5 to 5) is preferably used. For example, a target having a composition ratio of $In_2O_3$:$Ga_2O_3$:ZnO=1:1:2 [molar ratio] (x=1, y=1), or the like can be used. Alternatively, a target having a composition ratio of $In_2O_3$:$Ga_2O_3$:ZnO=1:1:1 [molar ratio] (x=1, y=0.5), a target having a composition ratio of $In_2O_3$:$Ga_2O_3$:ZnO=1:1:4 [molar ratio] (x=1, y=2), or a target having a composition ratio of $In_2O_3$:$Ga_2O_3$:ZnO=1:0:2 [molar ratio] (x=0, y=1) can be used.

In this embodiment, the oxide semiconductor layer 144 having an amorphous structure is formed by sputtering using a target for forming an In—Ga—Zn—O-based oxide semiconductor film.

It is preferable that a metal oxide contained in the target for forming an oxide semiconductor film have a relative density of 80% or higher, preferably 95% or higher, more preferably 99.9% or higher. With the use of the target having high relative density for forming an oxide semiconductor film, the oxide semiconductor layer 144 having a dense structure can be formed.

The atmosphere in which the oxide semiconductor layer 144 is formed is preferably a rare gas (typically argon) atmosphere, an oxygen atmosphere, or a mixed atmosphere of a rare gas (typically argon) and oxygen. Specifically, it is preferable to use a high-purity gas atmosphere, for example, from which an impurity such as hydrogen, water, a hydroxyl group, or a hydride is removed so that the concentration is 1 ppm or lower (preferably 10 ppb or lower).

In forming the oxide semiconductor layer 144, a material to be processed is held in a treatment chamber that is maintained at reduced pressure and is heated so that the temperature of the material to be processed is higher than or equal to 100° C. and lower than 550° C., preferably 200° C. to 400° C. inclusive. Alternatively, the temperature of the material to be processed in forming the oxide semiconductor layer 144 may be room temperature. Then, a sputtering gas from which hydrogen, water, and the like are removed is introduced while moisture in the treatment chamber is removed, whereby the oxide semiconductor layer 144 is formed using the above-described target. The oxide semiconductor layer 144 is formed while the material to be processed is heated, so that an impurity contained in the oxide semiconductor layer 144 can be reduced. Moreover, damage due to sputtering can be reduced. An entrapment vacuum pump is preferably used in order to remove moisture in the treatment chamber. For example, a cryopump, an ion pump, or a titanium sublimation pump can be used. A turbo pump provided with a cold trap may be used. By evacuation with the cryopump or the like, hydrogen, water, and the like can be removed from the treatment chamber, whereby the impurity concentration of the oxide semiconductor layer 144 can be reduced.

The oxide semiconductor layer 144 can be formed under the following conditions, for example: the distance between the material to be processed and the target is 170 mm; the pressure is 0.4 Pa; the direct-current (DC) power is 0.5 kW; and the atmosphere is an oxygen (the proportion of the oxygen flow is 100%) atmosphere, an argon (the proportion of the argon flow is 100%) atmosphere, or a mixed atmosphere of oxygen and argon. Note that it is preferable to use a pulse direct current (DC) power supply because powder substances (also referred to as particles or dust) generated in film deposition can be reduced and the thickness distribution can be uniform. The thickness of the oxide semiconductor layer 144 is 1 nm to 50 nm inclusive, preferably 1 nm to 30 nm inclusive, more preferably 1 nm to 10 nm inclusive. Using the oxide semiconductor layer 144 with such a thickness can suppress a short-channel effect due to miniaturization. Note that an appropriate thickness differs depending on an oxide semiconductor material used, the usage of a semiconductor device, or the like; therefore, it is also possible to set the thickness as appropriate depending on the material to be used, the usage, or the like.

Note that before the oxide semiconductor layer 144 is formed by sputtering, a material attached to a surface over which the oxide semiconductor layer 144 is formed (e.g., a surface of the interlayer insulating layer 128) is preferably removed by reverse sputtering in which an argon gas is introduced and plasma is generated. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a material to be processed. Note that a nitrogen atmosphere, a helium atmosphere, an oxygen atmosphere, or the like may be used instead of an argon atmosphere.

After that, heat treatment (first heat treatment) is preferably performed on the oxide semiconductor layer 144. Excess hydrogen (including water and a hydroxyl group) contained in the oxide semiconductor layer 144 can be removed by the first heat treatment; thus, the structure of the oxide semiconductor layer can be improved and a defect level in an energy gap can be reduced. The temperature of the first heat treatment is, for example, higher than or equal to 300° C. and lower than 550° C., or 400° C. to 500° C. inclusive.

The heat treatment can be performed in such a manner that, for example, an object is introduced into an electric furnace in which a resistance heating element or the like is used, and heated in a nitrogen atmosphere at 450° C. for an hour. The oxide semiconductor layer 144 is not exposed to the air during the heat treatment so that entry of water and hydrogen can be prevented.

The heat treatment apparatus is not limited to the electric furnace and may be an apparatus for heating an object by thermal radiation or thermal conduction from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. The object is put in an inert gas atmosphere that has been heated, heated for several minutes, and taken out from the inert gas atmosphere. The GRTA process enables time for high-temperature heat treatment to be short. Moreover, the GRTA process can be employed even when the temperature exceeds the upper temperature limit of the object. Note that the inert gas may be changed to a gas containing oxygen during the process. This is because a defect level in an energy gap caused by oxygen vacancy can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6N (99.9999%) or higher, preferably 7N (99.99999%) or higher (i.e., the impurity concentration is 1 ppm or lower, preferably 0.1 ppm or lower).

In any case, the i-type (intrinsic) or substantially i-type oxide semiconductor layer 144 in which impurities are reduced by the first heat treatment is formed, which enables a transistor having extremely excellent characteristics to be realized.

The above heat treatment (first heat treatment) can be referred to as dehydration treatment, dehydrogenation treatment, or the like because of its effect of removing hydrogen, water, and the like. The dehydration treatment or dehydrogenation treatment can be performed, for example, after the oxide semiconductor layer is formed, after the gate insulating layer is formed, or after the gate electrode is formed. Such dehydration treatment or dehydrogenation treatment may be performed once or plural times.

Figure 8C:
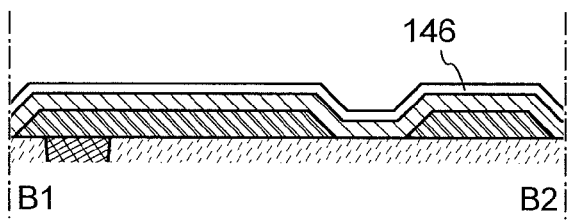

Next, the gate insulating layer 146 which is in contact with the oxide semiconductor layer 144 is formed (see FIG. 8C). The gate insulating layer 146 can be formed by a CVD method, sputtering, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (HfSi$_x$O$_y$, (x>0, y>0)), hafnium silicate (HfSi$_x$O$_y$, (x>0, y>0)) to which nitrogen is added, hafnium aluminate (HfAl$_x$O$_y$, (x>0, y>0)) to which nitrogen is added, or the like. The gate insulating layer 146 may have a single-layer structure or a layered structure. There is no particular limitation on the thickness; however, in the case where a semiconductor device is miniaturized, the thickness is preferably small for ensuring operation of the transistor. For example, in the case where silicon oxide is used, the thickness can be set to 1 nm to 100 nm inclusive, preferably 10 nm to 50 nm inclusive.

As described above, when the gate insulating layer 146 is thin, there is a problem of gate leakage due to a tunneling effect or the like. In order to solve the problem of gate leakage, a high dielectric constant (high-k) material such as hafnium oxide, tantalum oxide, yttrium oxide, hafnium silicate (HfSi$_x$O$_y$, (x>0, y>0)), hafnium silicate (HfSi$_x$O$_y$, (x>0, y>0)) to which nitrogen is added, hafnium aluminate (HfAl$_x$O$_y$, (x>0, y>0)) to which nitrogen is added is preferably used for the gate insulating layer 146. By using a high-k material for the gate insulating layer 146, electrical characteristics can be ensured and the thickness can be large to prevent gate leakage. Note that a layered structure of a film containing a high-k material and a film containing any one of silicon oxide, silicon nitride, silicon oxynitride, silicon nitride oxide, aluminum oxide, and the like may be employed.

After the gate insulating layer 146 is formed, second heat treatment is desirably performed in an inert gas atmosphere or an oxygen atmosphere. The temperature of the heat treatment is set to 200° C. to 450° C. inclusive, preferably 250° C. to 350° C. inclusive. For example, the heat treatment may be performed at 250° C. for 1 hour in a nitrogen atmosphere. The second heat treatment can reduce variation in electrical characteristics of the transistor. Further, in the case where the gate insulating layer 146 contains oxygen, oxygen is supplied to the oxide semiconductor layer 144 to cover oxygen vacancy in the oxide semiconductor layer 144, so that an i-type (intrinsic semiconductor) or substantially i-type oxide semiconductor layer can be formed.

Note that the second heat treatment is performed in this embodiment after the gate insulating layer 146 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

Figure 8D:
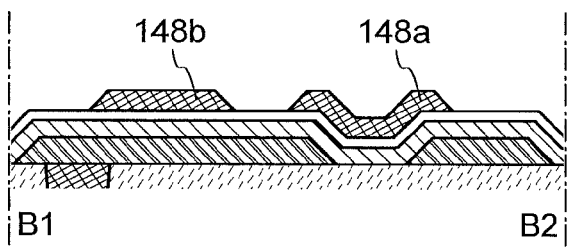

Next, the gate electrode 148a is formed over the gate insulating layer 146 in a region overlapping with the oxide semiconductor layer 144 and the electrode 148b is formed over the source or drain electrode 142a (see FIG. 8D). The gate electrode 148a and the electrode 148b can be formed in such a manner that a conductive layer is formed over the gate insulating layer 146 and then selectively etched. The conductive layer to be the gate electrode 148a and the electrode 148b can be formed by a PVD method typified by sputtering or a CVD method such as a plasma CVD method. The details are similar to those of the source or drain electrode 142a or the like; thus, the description thereof can be referred to.

Figure 8E:
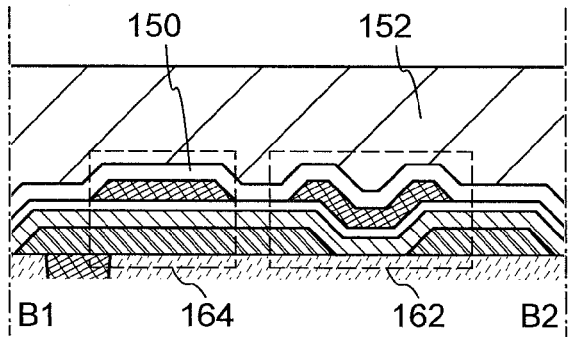

Next, the interlayer insulating layer 150 and the interlayer insulating layer 152 are formed over the gate insulating layer 146, the gate electrode 148a and the electrode 148b (see FIG. 8E). The interlayer insulating layers 150 and 152 can be formed by a PVD method, a CVD method, or the like. The interlayer insulating layers 150 and 152 can be formed using a material containing an inorganic insulating material such as silicon oxide, silicon oxynitride, silicon nitride, hafnium oxide, aluminum oxide, or tantalum oxide. Note that a layered structure of the interlayer insulating layers 150 and 152 is used in Embodiment 4, but one embodiment of the disclosed invention is not limited to this example. A single-layer structure or a layered structure including two or more layers can also be used. Alternatively, an interlayer insulating layer is not necessarily provided.

Note that the interlayer insulating layer 152 is desirably formed so as to have a planarized surface. This is because an electrode, a wiring, or the like can be favorably formed over the interlayer insulating layer 152 even in the case where the semiconductor device is miniaturized, for example. The interlayer insulating layer 152 can be planarized using a method such as CMP (chemical mechanical polishing).

Through the above steps, the transistor 162 using the highly purified oxide semiconductor layer 144 is completed (see FIG. 8E). In addition, the capacitor 164 is completed.

The transistor 162 illustrated in FIG. 8E includes the oxide semiconductor layer 144, the source or drain electrode 142a and the source or drain electrode 142b which are electrically connected to the oxide semiconductor layer 144, the gate insulating layer 146 covering the oxide semiconductor layer 144, the source or drain electrode 142a, and the source or drain electrode 142b, and the gate electrode 148a over the gate insulating layer 146. Further, the capacitor 164 includes the source or drain electrode 142a, the oxide semiconductor layer 144, the gate insulating layer 146 covering the source or drain electrode 142a, and the electrode 148b over the gate insulating layer 146.

Since the oxide semiconductor layer 144 is highly purified in the transistor 162 illustrated in this embodiment, the hydrogen concentration is $5\times10^{19}$ atoms/cm$^3$ or lower, preferably $5\times10^{18}$ atoms/cm$^3$ or lower, more preferably $5\times10^{17}$ atoms/cm$^3$ or lower. In addition, the value of the carrier concentration of the oxide semiconductor layer 144 is sufficiently low (e.g., lower than $1\times10^{12}$/cm$^3$, preferably lower than $1.45\times10^{10}$/cm$^3$) in comparison with that of a general silicon wafer (silicon wafer to which an impurity element such as phosphorus or boron is slightly added) (approximately $1\times10^{14}$/cm$^3$). Thus, the off-state current is sufficiently low. For example, the off-state current (a value per channel width unit (1 μm)) of the transistor 162 at room temperature is 100 zA/μm (1 zA (zepto-ampere) is $1\times10^{-21}$ A) or lower, preferably 10 zA/μm or lower.

With the use of the oxide semiconductor layer 144 which is highly purified and becomes intrinsic, the off current of the transistor can be sufficiently reduced. Then, by using such a transistor, a semiconductor device in which stored data can be stored for an extremely long time can be obtained.

The structures, methods, and the like described in this embodiment can be combined as appropriate with any of the structures, methods, and the like described in the other embodiments.

[Embodiment 5]

In this embodiment, a structure and a manufacturing method of a semiconductor device of one embodiment of the disclosed invention, which are different from those of Embodiment 4, will be described with reference to FIGS. 9A and 9B, and FIGS. 10A to 10D.

<Cross-sectional Structure and Planar Structure of Semiconductor Device>

Figure 9A:
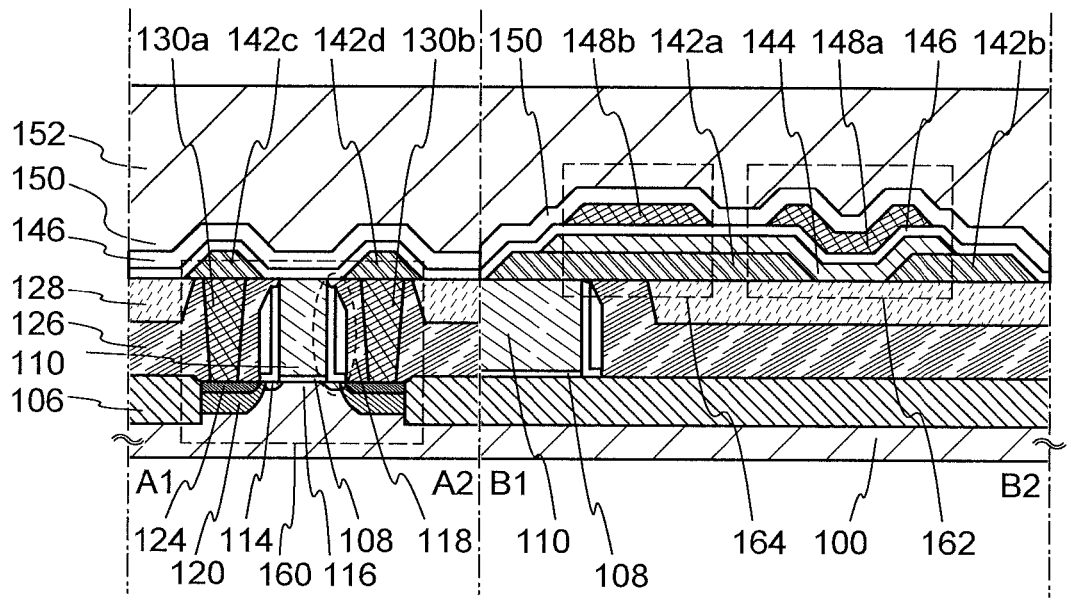
FIGS. 9A and 9B are a cross-sectional view and a plan view of a semiconductor device.
Figure 9B:
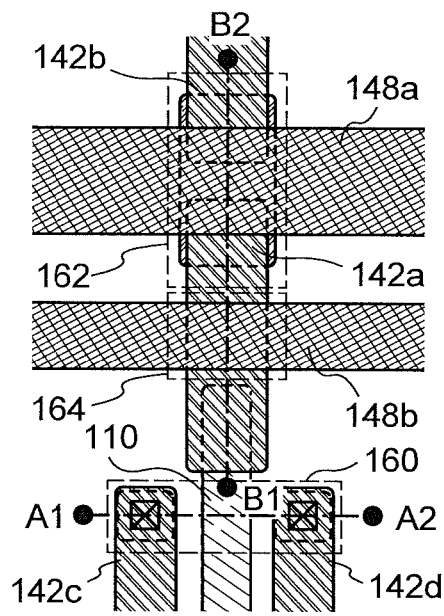

FIGS. 9A and 9B illustrate one example of a structure of the semiconductor device. FIG. 9A illustrates a cross section of the semiconductor device, and FIG. 9B illustrates a plan view of the semiconductor device. Here, FIG. 9A corresponds to a cross-section taken along line A1-A2 and line B1-B2 of FIG. 9B. The semiconductor device illustrated in FIGS. 9A and 9B includes, in a lower portion, the transistor 160 using a semiconductor material other than an oxide semiconductor, and in an upper portion, the transistor 162 using an oxide semiconductor. A transistor formed using a semiconductor material other than an oxide semiconductor easily operates at high speed. On the other hand, a transistor including an oxide semiconductor can hold charge for a long time owing to its characteristics.

Note that although all the transistors are n-channel transistors here, it goes without saying that p-channel transistors can be used. In addition, because the technical nature of the disclosed invention is to use an oxide semiconductor in the transistor 162 so that data can be stored, it is not necessary to limit a specific structure of a semiconductor device to the structure described here.

The transistor 160 in each of FIGS. 9A and 9B includes the channel formation region 116 in a substrate 100 containing a semiconductor material (for example, silicon); the impurity regions 114 and the high-concentration regions 120, a combination of the impurity regions 114 and the high-concentration regions 120 can simply be referred to as impurity regions, impurity regions between which is provided the channel formation region 116; a gate insulating layer 108 over the channel formation region 116; the gate electrode 110 over the gate insulating layer 108; the source or drain electrode 130a electrically connected to an impurity region; and the source or drain electrode 130b electrically connected to an impurity region. Further, a wiring 142c and a wiring 142d are formed over the source or drain electrode 130a and the source or drain electrode 130a, respectively.

A sidewall insulating layer 118 is provided on a side surface of the gate electrode 110. Moreover, as illustrated in the cross-sectional view, the high-concentration impurity regions 120 are formed in a region of the substrate 100 which does not overlap with the sidewall insulating layers 118, and the metal compound regions 124 are present in contact with the high-concentration impurity regions 120. In addition, the element isolation insulating layer 106 is provided over the substrate 100 so as to surround the transistor 160. An interlayer insulating layer 126 and the interlayer insulating layer 128 are provided so as to expose the top surface of the gate electrode 110 cover the transistor 160. The source or drain electrode 130a and the source or drain electrode 130b are electrically connected to the metal compound regions 124 through openings formed in the interlayer insulating layers 126 and 128. That is, the source or drain electrode 130a and the source or drain electrode 130b are electrically connected to the high-concentration impurity regions 120 and the impurity regions 114 through the metal compound regions 124. Note that the sidewall insulating layers 118 are not formed in some cases, for integration of the transistor 160.

The transistor 162 in each of FIG. 9A and FIG. 9B includes a source or drain electrode 142a and a source or drain electrode 142b which are provided over an interlayer insulating layer 128, an island-shaped oxide semiconductor layer 144 electrically connected to the source or drain electrode 142a and the source or drain electrode 142b, a gate insulating layer 146 covering the source or drain electrode 142a, the source or drain electrode 142b, and the island-shaped oxide semiconductor layer 144, and a gate electrode 148a provided over the gate insulating layer 146 so as to overlap with the island-shaped oxide semiconductor layer 144.

Here, the source or drain electrode 142a is formed directly on the gate electrode 110, whereby the transistor 160 in the lower portion and the transistor 162 in the upper portion are electrically connected to each other. That is, the semiconductor device described in this embodiment has a structure in which the transistor 162 in the upper portion is formed above the transistor 160 in the lower portion, from which a portion over the top surface of the gate electrode 110a is removed, in the semiconductor device described in Embodiment 4.

Note that the oxide semiconductor layer 144 is preferably an oxide semiconductor layer which is highly purified by sufficiently removing impurity such as hydrogen therefrom or by supplying a sufficient amount of oxygen thereto. Specifically, the hydrogen concentration of the oxide semiconductor layer 144 is $5\times10^{19}$ atoms/cm$^3$ or lower, preferably $5\times10^{18}$ atoms/cm$^3$ or lower, more preferably $5\times10^{17}$ atoms/cm$^3$ or lower. Note that the hydrogen concentration of the oxide semiconductor layer 144 is measured by secondary ion mass spectrometry (SIMS). In the oxide semiconductor layer 144 which is highly purified by sufficiently reducing the hydrogen concentration therein and in which a defect level in an energy gap due to oxygen deficiency is reduced by supplying a sufficient amount of oxygen, the carrier concentration is lower than $1\times10^{12}$/cm$^3$, preferably lower than $1\times10^{11}$/cm$^3$, more preferably lower than $1.45\times10^{10}$/cm$^3$. For example, the off-state current (per unit channel width (1 μm), here) of the transistor 162 at room temperature is 100 zA/μm (1 zA (zepto-ampere) is $1\times10^{-21}$ A) or lower, preferably 10 zA/μm or lower. The transistor 162 with significantly excellent off-state current characteristics can be obtained with the use of such an oxide semiconductor which is made to be an i-type (intrinsic) oxide semiconductor or a substantially i-type oxide semiconductor.

The capacitor 164 includes the source or drain electrode 142a, the oxide semiconductor layer 144, the gate insulating layer 146, and an electrode 148b. That is, the source or drain electrode 142a functions as one electrode of the capacitor 164 and the electrode 148b functions as the other electrode of the capacitor 164.

Note that in the capacitor 164 illustrated in FIG. 9A, insulating properties between the source or drain electrode 142a and the electrode 148b can be adequately secured by stacking the oxide semiconductor layer 144 and the gate insulating layer 146.

Note that in the transistor 162 and the capacitor 164, edge portions of the source or drain electrode 142a and the source or drain electrode 142b are preferably tapered. Here, a taper angle is, for example, 30° to 60° inclusive. Note that the "taper angle" means an inclination angle formed by a side surface and a bottom surface of a layer (for example, the source or drain electrode 142a) having a tapered shape when being observed in a direction perpendicular to the cross-section (a plane which is perpendicular to the surface of the substrate). When the edge portions of the source or drain electrode 142a and the source or drain electrode 142b are tapered, the coverage of the oxide semiconductor layer 144 can be improved and disconnection can be prevented.

Further, an interlayer insulating layer 150 is provided over the transistor 162 and the capacitor 164 and an interlayer insulating layer 152 is provided over the interlayer insulating layer 150.

<Method for Manufacturing Semiconductor Device>

Next, an example of a method for manufacturing the semiconductor device will be described below. Hereinafter, steps performed after formation of the transistor 160 in the lower portion and a method for manufacturing the transistor 162 in the upper portion will be described with reference to FIGS. 10A to 10D. The method of forming the transistor 160 in the lower portion is similar to that in Embodiment 4; thus, the description in Embodiment 4 can be referred to.

Figure 10A:
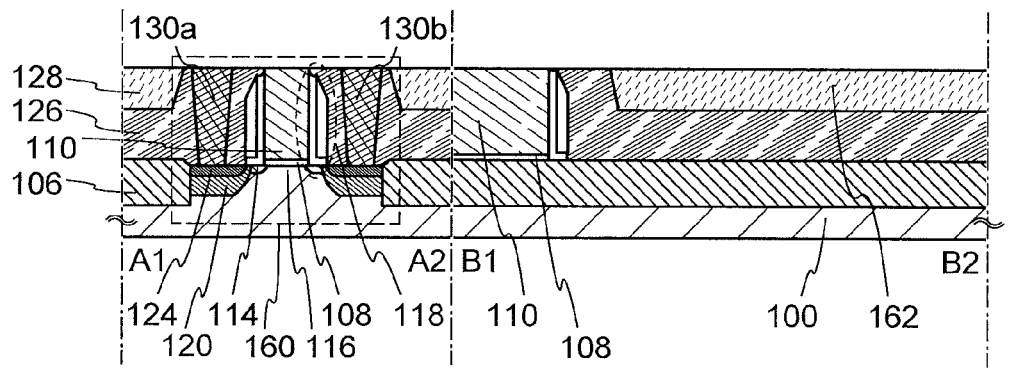
FIGS. 10A to 10D are cross-sectional views relating to a manufacturing process of a semiconductor device.

The transistor 160 in the lower portion is formed by the method described in Embodiment 4, and then, a portion of the transistor 160 over a top surface of the gate electrode 110 is removed (see FIG. 10A). The portion of the transistor 160 is removed by polishing treatment (CMP) performed on the transistor 160 in the lower portion until the top surface of the gate electrode 110 is exposed. Thus, portions of the interlayer insulating layer 126, the interlayer insulating layer 128, the source or drain electrode 130a, and the source or drain electrode 130b which are over the gate electrode 110 are removed. At that time, the surface including the interlayer insulating layer 126, the interlayer insulating layer 128, the source or drain electrode 130a, and the source or drain electrode 130b is planarized; thus, an electrode, a wiring, an insulating layer, a semiconductor layer, and the like can be formed preferably in later steps. The electrode 130c illustrated in Embodiment 4 is not necessarily formed because it is completely removed by CMP.

The top surface of the gate electrode 110 is exposed by CMP as described above, whereby the gate electrode 110 can be directly connected to the source or drain electrode 142a. Therefore, the transistor 160 and the transistor 162 can be electrically connected to each other with ease.

Figure 10B:
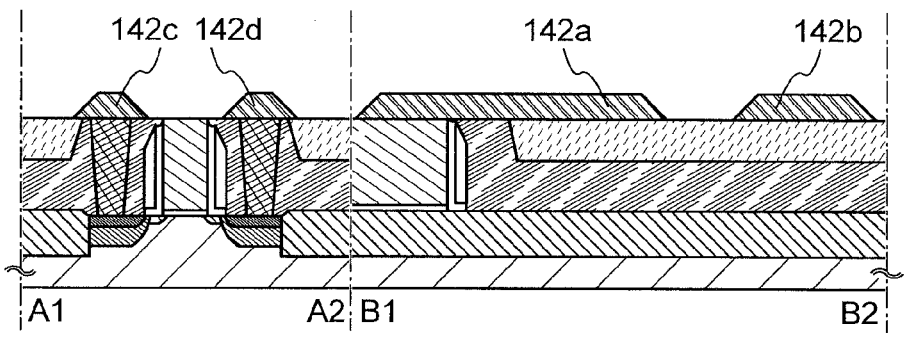

Next, a conductive layer are formed over the interlayer insulating layer 126 and the interlayer insulating layer 128 and selectively etched to form the source or drain electrode 142a, the source or drain electrode 142b, the wiring 142c, and the wiring 142d (see FIG. 10B). Here, the source or drain electrode 142a, the wiring 142c, and the wiring 142d are formed to be directly connected to the gate electrode 110, the source or drain electrode 130a, and the source or drain electrode 130b, respectively.

Here, the conductive layer forming the source or drain electrode 142a, the source or drain electrode 142b, the wiring 142c, and the wiring 142d can be formed with the use of the material similar to that in Embodiment 4; thus, the description in Embodiment 4 can be referred to. Further, etching of the conductive layer can be performed in a manner similar to that of etching performed in Embodiment 4; thus, the description in Embodiment 4 can be referred to.

In addition, as illustrated in Embodiment 4, an insulating layer may be formed over the source or drain electrode 142a and the source or drain electrode 142b. Providing the insulating layer can reduce parasitic capacitance formed between the gate electrode to be formed in a later step and the source and drain electrodes 142a and 142b.

Figure 10C:
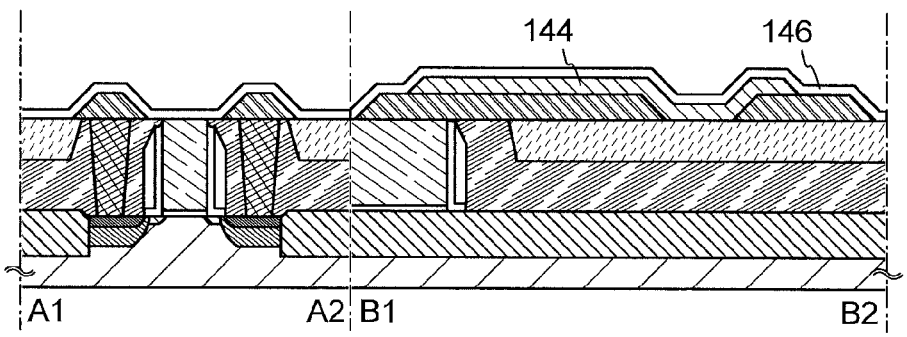

Then, an oxide semiconductor layer is formed to cover the source or drain electrode 142a, the source or drain electrode 142b, the wiring 142c, and the wiring 142d and selectively etched to form the oxide semiconductor layer 144 so as to be in contact with the source or drain electrode 142a and the source or drain electrode 142b (see FIG. 10C).

The oxide semiconductor layer can be formed with the use of a material and a method which are similar to those in Embodiment 4; thus, the description in Embodiment 4 can be referred to.

The oxide semiconductor layer formed in such a manner is processed to have an island shape by etching using a mask, or the like, so that the island-shaped oxide semiconductor layer 144 is formed.

As a method for etching the oxide semiconductor layer, either dry etching or wet etching may be employed. Needless to say, dry etching and wet etching can be used in combination. The etching conditions (e.g., an etching gas or an etchant, etching time, and temperature) are set as appropriate depending on the material so that the oxide semiconductor layer can be etched into a desired shape.

In addition, the oxide semiconductor layer 144 is preferably subjected to heat treatment (first heat treatment) as described in Embodiment 4. The first heat treatment can be performed by the method described in Embodiment 4; thus, the description therein can be referred to. The i-type (intrinsic) or substantially i-type oxide semiconductor layer 144 in which impurities are reduced by the first heat treatment is formed, which enables a transistor having extremely excellent characteristics to be realized. Note that the first heat treatment may be performed either before the oxide semiconductor is etched or after the oxide semiconductor layer is processed to have an island shape by etching.

Next, the gate insulating layer 146 is formed in contact with the oxide semiconductor layer 144 (see FIG. 10C)

The gate insulating layer 146 can be formed with the use of a material and a method which are similar to those in Embodiment 4; thus, the description in Embodiment 4 can be referred to.

Further, after the gate insulating layer 146 is formed, second heat treatment is desirably performed in an inert gas atmosphere or an oxygen atmosphere as described in Embodiment 4. The second heat treatment can be performed by the method described in Embodiment 4; thus, the description therein can be referred to. The second heat treatment can reduce variation in electrical characteristics of the transistor. Further, in the case where the gate insulating layer 146 contains oxygen, oxygen is supplied to the oxide semiconductor layer 144 to cover oxygen vacancy in the oxide semiconductor layer 144, so that an i-type (intrinsic semiconductor) or substantially i-type oxide semiconductor layer can be formed.

Note that the second heat treatment is performed in this embodiment after the gate insulating layer 146 is formed; the timing of the second heat treatment is not limited thereto. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

Figure 10D:
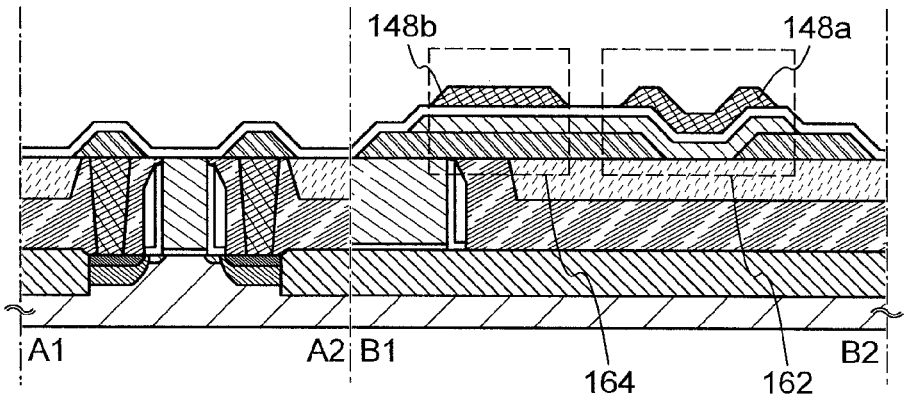

Next, the gate electrode 148a is formed over the gate insulating layer 146 in a region overlapping with the oxide semiconductor layer 144 and the electrode 148b is formed over the source or drain electrode 142a (see FIG. 10D). The gate electrode 148a and the electrode 148b can be formed in such a manner that a conductive layer is formed over the gate insulating layer 146 and then selectively etched. The conductive layer to be the gate electrode 148a and the electrode 148b can be formed by a PVD method typified by sputtering or a CVD method such as a plasma CVD method. The details are similar to those of the source or drain electrode 142a or the like; thus, the description thereof can be referred to.

Next, as described in Embodiment 4, the interlayer insulating layer 150 and the interlayer insulating layer 152 are formed over the gate insulating layer 146, the gate electrode 148a and the electrode 148b. The interlayer insulating layer 150 and the interlayer insulating layer 152 can be formed with the use of a material and a method which are similar to those in Embodiment 4; thus, the description in Embodiment 4 can be referred to.

Note that the interlayer insulating layer 152 is desirably formed so as to have a planarized surface. This is because an electrode, a wiring, or the like can be favorably formed over the interlayer insulating layer 152 even in the case where the semiconductor device is miniaturized, for example. The interlayer insulating layer 152 can be planarized using a method such as CMP (chemical mechanical polishing).

Through the above steps, the transistor 162 using the highly purified oxide semiconductor layer 144 is completed (see FIG. 10D). In addition, the capacitor 164 is completed.

The transistor 162 illustrated in FIG. 10D includes the oxide semiconductor layer 144, the source or drain electrode 142a and the source or drain electrode 142b which are electrically connected to the oxide semiconductor layer 144, the gate insulating layer 146 covering the oxide semiconductor layer 144, the source or drain electrode 142a, and the source or drain electrode 142b, and the gate electrode 148a over the gate insulating layer 146. Further, the capacitor 164 includes the source or drain electrode 142a, the oxide semiconductor layer 144, the gate insulating layer 146 covering the source or drain electrode 142a, and the electrode 148b over the gate insulating layer 146.

Since the oxide semiconductor layer 144 is highly purified in the transistor 162 illustrated in this embodiment, the hydrogen concentration is $5\times10^{19}$ atoms/cm$^3$ or lower, preferably $5\times10^{18}$ atoms/cm$^3$ or lower, more preferably $5\times10^{17}$ atoms/cm$^3$ or lower. In addition, the value of the carrier concentration of the oxide semiconductor layer 144 is sufficiently low (e.g., lower than $1\times10^{12}$/cm$^3$, preferably lower than $1.45\times10^{10}$/cm$^3$) in comparison with that of a general silicon wafer (silicon wafer to which an impurity element such as phosphorus or boron is slightly added) (approximately $1\times10^{14}/cm^3$). Thus, the off-state current is sufficiently low. For example, the off-state current (a value per channel width unit (1 μm)) of the transistor 162 at room temperature is 100 zA/μm (1 zA (zepto-ampere) is $1\times10^{-21}$ A) or lower, preferably 10 zA/μm or lower.

With the use of the oxide semiconductor layer 144 which is highly purified and becomes intrinsic, the off current of the transistor can be sufficiently reduced. Then, by using such a transistor, a semiconductor device in which stored data can be stored for an extremely long time can be obtained.

The structures, methods, and the like described in this embodiment can be combined as appropriate with any of the structures, methods, and the like described in the other embodiments.

[Embodiment 6]

In Embodiment 6, a structure and a manufacturing method of a semiconductor device of one embodiment of the disclosed invention, which are different from those in Embodiments 4 and 5, will be described with reference to FIGS. 11A and 11B, FIGS. 12A to 12D, and FIGS. 13A to 13C.

<Cross-sectional Structure and Planar Structure of Semiconductor Device>

Figure 11A:
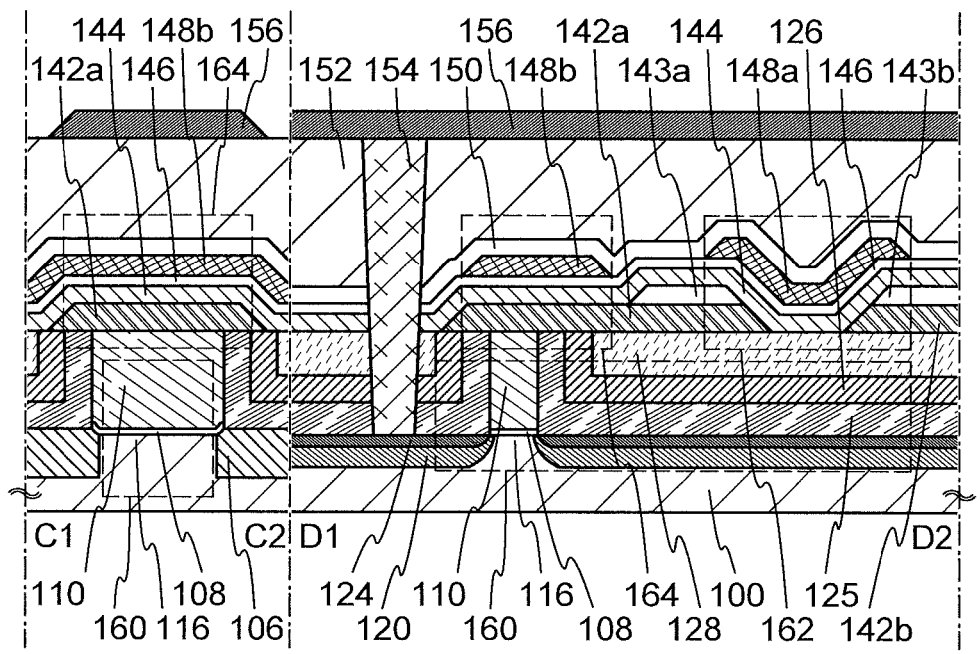
FIGS. 11A and 11B are a cross-sectional view and a plan view of a semiconductor device.
Figure 11B:
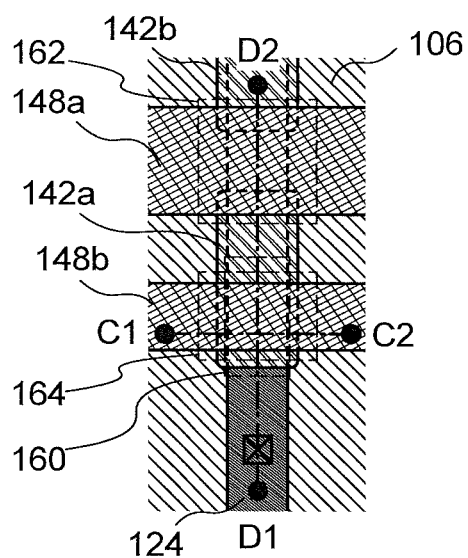

FIGS. 11A and 11B illustrate one example of a structure of the semiconductor device. FIG. 11A illustrates a cross section of the semiconductor device, and FIG. 11B illustrates a plan view of the semiconductor device. Here, FIG. 11A corresponds to a cross-section taken along line C1-C2 and line D1-D2 of FIG. 11B. The semiconductor device illustrated in FIGS. 11A and 11B includes, in a lower portion, the transistor 160 using a material other than an oxide semiconductor, and in an upper portion, the transistor 162 using an oxide semiconductor. A transistor formed using a material other than an oxide semiconductor easily operates at high speed. On the other hand, a transistor including an oxide semiconductor can hold charge for a long time owing to its characteristics.

Note that although all the transistors are n-channel transistors here, it goes without saying that p-channel transistors can be used. In addition, because the technical nature of the disclosed invention is to use an oxide semiconductor in the transistor 162 so that data can be stored, it is not necessary to limit a specific structure of a semiconductor device to the structure described here.

The semiconductor device in FIGS. 11A and 11B is different from the semiconductor devices described in the above embodiments in a planar layout of the semiconductor device. In Embodiment 6, the transistor 162 and the capacitor 164 are provided so as to overlap with the transistor 160. By employing such a planar layout, higher integration is possible. For example, given that the minimum processing dimension is F, the area occupied by a memory cell can be 15 $F^2$ to 25 $F^2$.

The semiconductor device in FIGS. 11A and 11B is different from the semiconductor devices described in the above embodiments also in that the sidewall insulating layer 118 is not provided in the transistor 160. That is, the semiconductor device in FIGS. 11A and 11B does not include a sidewall insulating layer. Since a sidewall insulating layer is not formed, the impurity region 114 is not formed. Thus, in the case where the sidewall insulating layer is not provided, higher integration is easy as compared to the case where the sidewall insulating layer 118 is provided. In addition, the manufacturing process can be simplified as compared to the case where the sidewall insulating layer 118 is provided.

The semiconductor device in FIGS. 11A and 11B is different from the semiconductor devices described in the above embodiments also in that an interlayer insulating layer 125 is provided in the transistor 160. That is, the semiconductor device in FIGS. 11A and 11B includes the interlayer insulating layer 125. By using an insulating layer including hydrogen as the interlayer insulating layer 125, hydrogen can be supplied to the transistor 160 and the characteristics of the transistor 160 can be improved. As the interlayer insulating layer 125, for example, a silicon nitride layer including hydrogen, which is formed by a plasma CVD method, is given. Further, by using an insulating layer in which hydrogen is sufficiently reduced as the interlayer insulating layer 126, hydrogen which might adversely affect the characteristics of the transistor 162 can be prevented from being included in the transistor 162. As the interlayer insulating layer 126, for example, a silicon nitride layer formed by sputtering is given. When such a structure is employed, the characteristics of the transistor 160 and the transistor 162 can be improved sufficiently.

The semiconductor device in FIGS. 11A and 11B is different from the semiconductor devices described in the above embodiments also in that an insulating layer 143a and an insulating layer 143b are provided in the transistor 162. That is, the semiconductor device in FIGS. 11A and 11B includes the insulating layer 143a and the insulating layer 143b. By thus providing the insulating layer 143a and the insulating layer 143b, so-called gate capacitance formed by the gate electrode 148a and the source or drain electrode 142a (or the gate electrode 148a and the source or drain electrode 142b) can be reduced and the operation speed of the transistor 162 can be increased.

Note that as in Embodiment 5, the source or drain electrode 142a is formed directly on the gate electrode 110, whereby the transistor 160 in the lower portion and the transistor 162 in the upper portion are electrically connected to each other. With such a structure, the integration degree is increased as compared to the case where an electrode and a wiring are provided additionally. In addition, the manufacturing process is simplified.

Although the structure including all the differences is described in this embodiment, a structure including any one of the differences may be employed.

<Method for Manufacturing Semiconductor Device>

Next, an example of a method for manufacturing the semiconductor device will be described. Hereinafter, steps performed after formation of the transistor 160 in the lower portion and a method for manufacturing the transistor 162 in the upper portion will be described with reference to FIGS. 12A to 12D and FIGS. 13A to 13C. The transistor 160 in the lower portion can be manufactured by a method similar to that described in Embodiment 4. Embodiment 4 can be referred to for the details. Note that the three interlayer insulating layers 125, 126, and 128 are formed so as to cover the transistor 160 in this embodiment (cf. FIG. 7G). In addition, the source or drain electrode 130a and the source or drain electrode 130b are not formed in the manufacturing process of the transistor 160 in Embodiment 6 (cf. FIG. 7H); however, even the structure in which the source or drain electrode 130a and the source or drain electrode 130b are not formed is called the transistor 160 for convenience.

The transistor 160 in the lower portion is formed by the method described in Embodiment 4 first, and then a portion of the transistor 160 over a top surface of the gate electrode 110 is removed. For the removing step, polishing treatment such as chemical mechanical polishing (CMP) may be used. Thus, portions of the interlayer insulating layer 125, the interlayer insulating layer 126, and the interlayer insulating layer 128 over the top surface of the gate electrode 110 are removed. Note that the surface subjected to polishing treatment is planarized sufficiently, whereby an electrode, a wiring, an insulating layer, a semiconductor layer, and the like can be favorably formed in later steps.

Figure 12A:
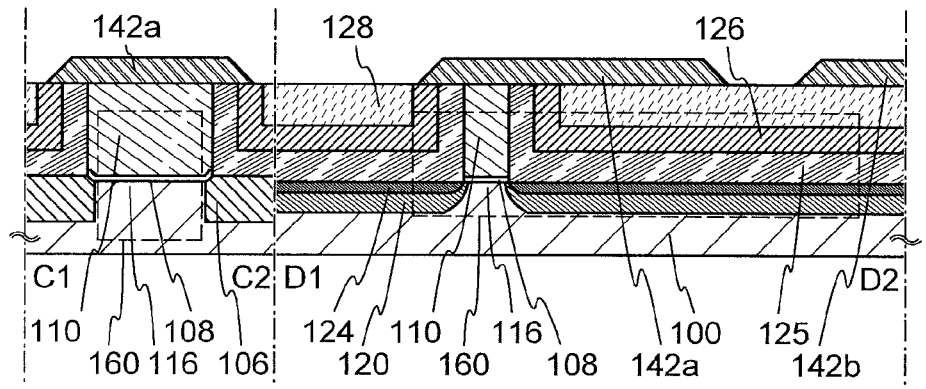
FIGS. 12A to 12D are cross-sectional views relating to a manufacturing process of a semiconductor device.

Then, a conductive layer is formed over the gate electrode 110, the interlayer insulating layer 125, the interlayer insulating layer 126, and the interlayer insulating layer 128, and the conductive layer is etched selectively, so that the source or drain electrode 142*a* and the source or drain electrode 142*b* are formed (see FIG. 12A). Here, the source or drain electrode 142*a* is formed so as to be directly connected to the gate electrode 110.

The conductive layer used for forming the source or drain electrode 142*a* and the source or drain electrode 142*b* can be formed using a material similar to that described in Embodiment 4. Further, the conductive layer can be etched by a method similar to that described in Embodiment 4. Embodiment 4 can be referred to for the details.

Figure 12B:
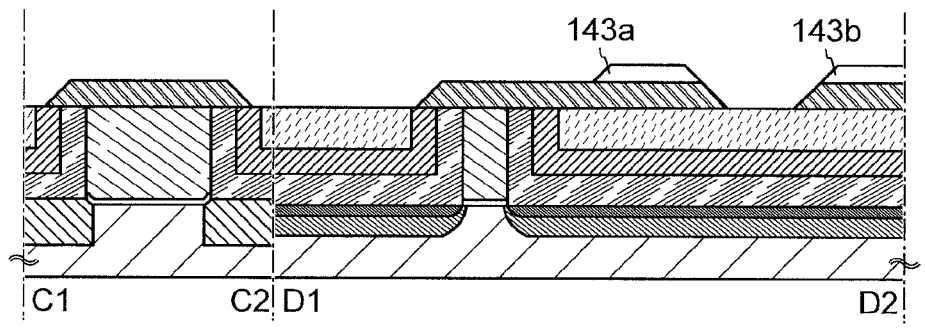

Next, an insulating layer is formed so as to cover the source or drain electrode 142*a* and the source or drain electrode 142*b* and etched selectively, so that the insulating layer 143*a* and the insulating layer 143*b* are formed over the source or drain electrode 142*a* and the source or drain electrode 142*b*, respectively (see FIG. 12B).

By providing the insulating layer 143*a* and the insulating layer 143*b*, parasitic capacitance formed between a gate electrode formed later and the source and drain electrodes 142*a* and 142*b* can be reduced.

Figure 12C:
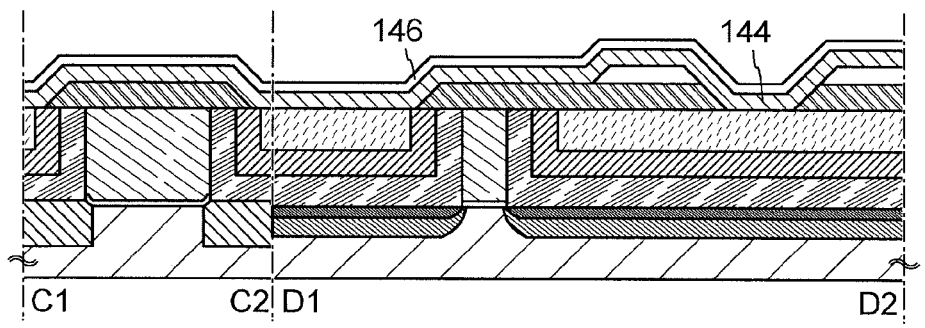

After that, the oxide semiconductor layer 144 is formed so as to cover the source or drain electrode 142*a* and the source or drain electrode 142*b*, and the gate insulating layer 146 is formed over the oxide semiconductor layer 144 (see FIG. 12C).

The oxide semiconductor layer 144 can be formed using the material and the method described in Embodiment 4. Further, the oxide semiconductor layer 144 is preferably subjected to heat treatment (first heat treatment). Embodiment 4 can be referred to for the details.

The gate insulating layer 146 can be formed using the material and the method described in Embodiment 4. After the gate insulating layer 146 is formed, heat treatment (second heat treatment) is preferably performed in an inert gas atmosphere or an oxygen atmosphere. Embodiment 4 can be referred to for the details.

Figure 12D:
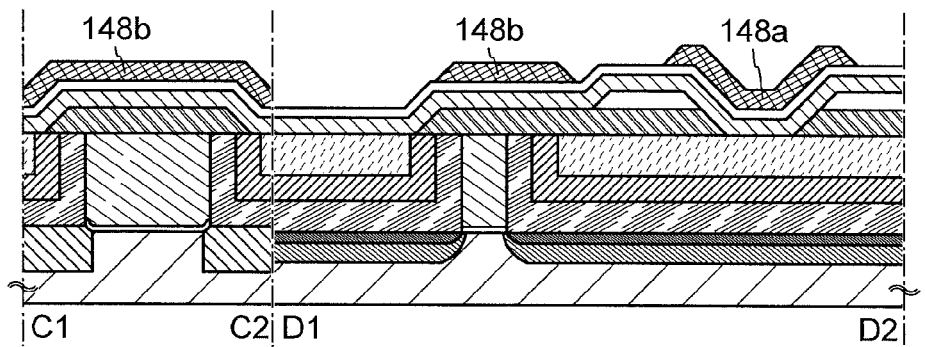

Then, over the gate insulating layer 146, the gate electrode 148*a* is formed in a region overlapping with a region of the transistor 162, which serves as a channel formation region, and the electrode 148*b* is formed in a region overlapping with the source or drain electrode 142*a* (see FIG. 12D).

The gate electrode 148*a* and the electrode 148*b* can be formed in such a manner that a conductive layer is formed over the gate insulating layer 146 and then etched selectively. The conductive layer to be the gate electrode 148*a* and the electrode 148*b* can be formed by a PVD method typified by sputtering or a CVD method such as a plasma CVD method. The details are similar to those of the source or drain electrode 142*a* or the like; thus, the description thereof can be referred to.

Figure 13A:
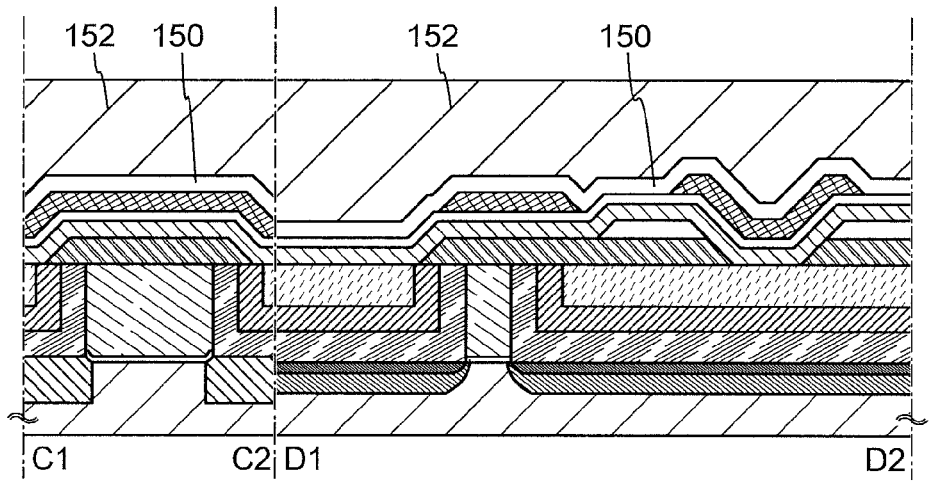
FIGS. 13A to 13C are cross-sectional views relating to a manufacturing process of a semiconductor device.

Next, the interlayer insulating layer 150 and the interlayer insulating layer 152 are formed over the gate insulating layer 146, the gate electrode 148*a*, and the electrode 148*b* (see FIG. 13A). The interlayer insulating layer 150 and the interlayer insulating layer 152 can be formed using the materials and the methods described in Embodiment 4. Embodiment 4 can be referred to for the details.

Note that the interlayer insulating layer 152 is preferably formed so as to have a planarized surface. By forming the interlayer insulating layer 152 so as to have a planarized surface, an electrode, a wiring, or the like can be favorably formed over the interlayer insulating layer 152 even in the case where the semiconductor device is reduced in size, for example. The interlayer insulating layer 152 can be planarized by a method such as chemical mechanical polishing (CMP).

Figure 13B:
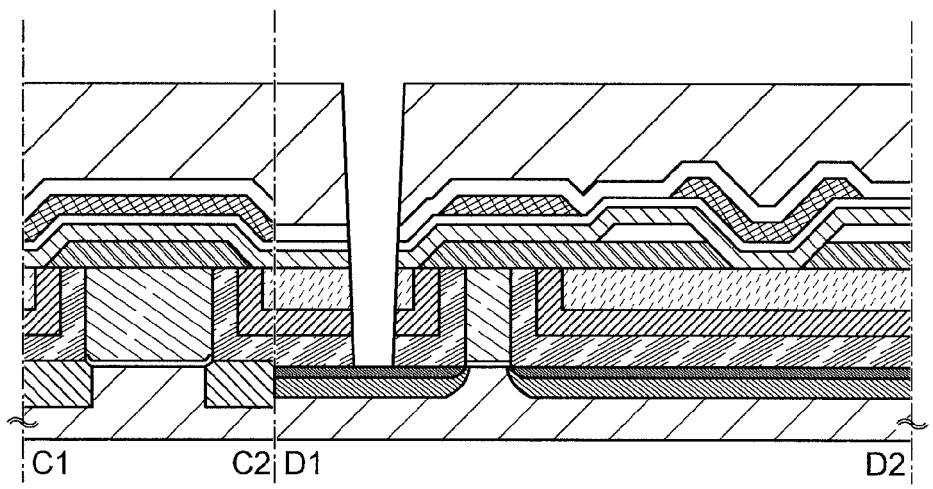

After that, the interlayer insulating layer 125, the interlayer insulating layer 126, the interlayer insulating layer 128, the oxide semiconductor layer 144, the gate insulating layer 146, the interlayer insulating layer 150, and the interlayer insulating layer 152 are selectively etched, so that an opening that reaches the metal compound region 124 of the transistor 160 is formed (see FIG. 13B). As the etching, either dry etching or wet etching may be used; in terms of microfabrication, dry etching is preferably used.

Figure 13C:
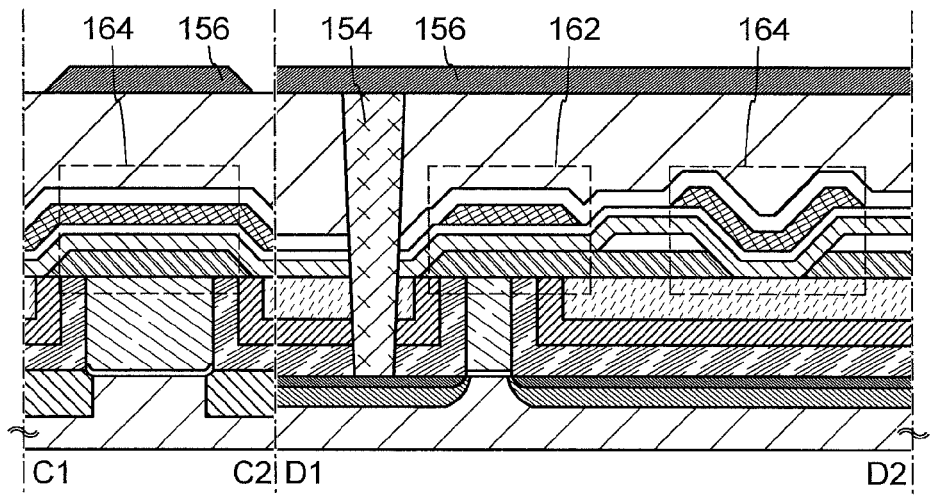

The source or drain electrode 154 is formed so as to be embedded in the opening, and a wiring 156 is formed over the interlayer insulating layer 152 so as to be in contact with the electrode 154 (see FIG. 13C). The source or drain electrode 154 can be formed in such a manner, for example, that a conductive layer is formed in a region including the opening by a PVD method, a CVD method, or the like and then part of the conductive layer is removed by etching, CMP, or the like.

Specifically, it is possible to employ a method, for example, in which a thin titanium film is formed in a region including the opening by a PVD method, a thin titanium nitride film is formed by a CVD method, and then a tungsten film is formed so as to be embedded in the opening. Here, the titanium film formed by a PVD method has a function of reducing an oxide film (such as a natural oxide film) formed on a surface over which the titanium film is formed, thereby lowering the contact resistance with a lower electrode or the like (the metal compound region 124, here). The titanium nitride film formed after the formation of the titanium film has a barrier function of preventing diffusion of the conductive material. A copper film may be formed by a plating method after the formation of the barrier film of titanium, titanium nitride, or the like.

The wiring 156 can be formed by forming a conductive layer by a PVD method such as a sputtering method, or a CVD method such as a plasma CVD method, and by patterning the conductive layer. As a material for the conductive layer, an element selected from aluminum, chromium, copper, tantalum, titanium, molybdenum, and tungsten; an alloy including any of these elements as a component; or the like can be used. Further, one or more materials selected from manganese, magnesium, zirconium, beryllium, neodymium, and scandium may be used. The details are the same as source electrode or drain electrode 142*a*.

Through the above steps, the semiconductor device including the transistor 160, the transistor 162, and the capacitor 164 is completed.

In the semiconductor device described in Embodiment 6, for example, the transistor 162 and the capacitor 164 overlap with the transistor 160, the transistor 160 does not include a sidewall insulating layer, the source or drain electrode 142*a* is formed directly on the gate electrode 110; therefore, higher integration is possible. Further, the manufacturing process is simplified.

Further, in the semiconductor device described in Embodiment 6, an insulating layer containing hydrogen and an insulating layer with a reduced hydrogen concentration are used as the interlayer insulating layer 125 and the interlayer insulating layer 126, respectively; thus, characteristics of the transistors 160 and 162 are improved. Owing to the insulating layers 143*a* and 143*b*, so-called gate capacitance is reduced and thus, an operating speed of the transistor 162 is increased.

The above features described in this embodiment make it possible to provide a semiconductor device having significantly excellent characteristics.

The structures, methods, and the like described in Embodiment 6 can be combined as appropriate with any of the structures, methods, and the like described in the other embodiments.

[Embodiment 7]

In Embodiment 7, the cases where the semiconductor device described in any of the above embodiments is applied to an electronic device will be described with reference to FIGS. 14A to 14F. In Embodiment 7, the case where the above-described semiconductor device is applied to an electronic device such as a computer, a mobile phone (also referred to as a mobile telephone or a mobile telephone device), a portable information terminal (including a portable game machine, an audio reproducing device, and the like), a digital camera, a digital video camera, electronic paper, or a television device (also referred to as a television or a television receiver).

Figure 14A:
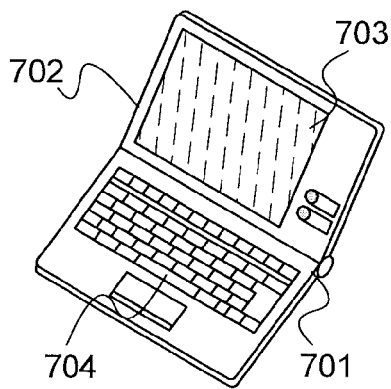
FIGS. 14A to 14F are diagrams for illustrating electronic devices including a semiconductor device.

FIG. 14A is a laptop computer including a housing 701, a housing 702, a display portion 703, a keyboard 704, and the like. The semiconductor devices described in any of the above embodiments are provided in the housing 701 and the housing 702. Therefore, the laptop computer can perform writing and reading data at high speed, store data for a long time, and operate with sufficiently low power consumption.

Figure 14D:
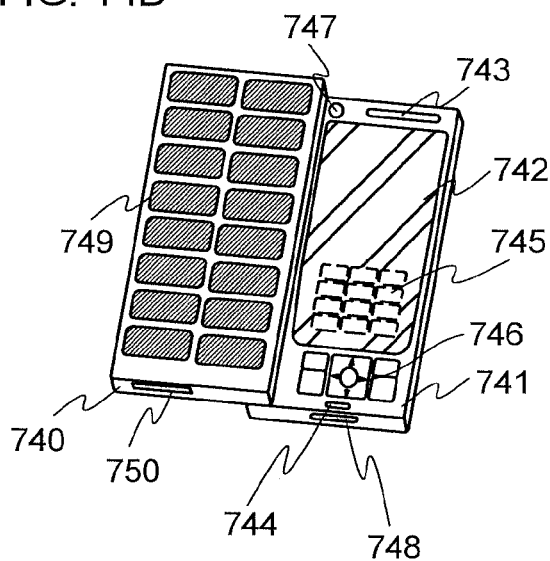
Figure 14B:
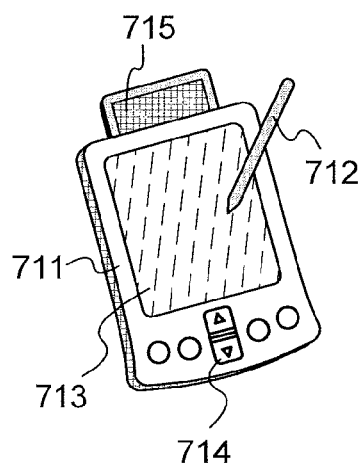

FIG. 14B is a portable information terminal (personal digital assistance (PDA)). A main body 711 is provided with a display portion 713, an external interface 715, operation buttons 714, and the like. Further, a stylus 712 for operating the portable information terminal or the like is also provided. The semiconductor device described in any of the above embodiments is provided in the main body 711. Therefore, the portable information terminal can perform writing and reading data at high speed, store data for a long time, and operate with sufficiently low power consumption.

Figure 14E:
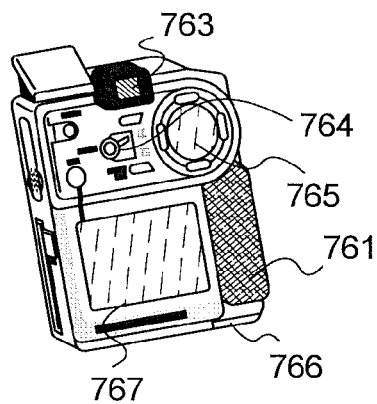
Figure 14C:
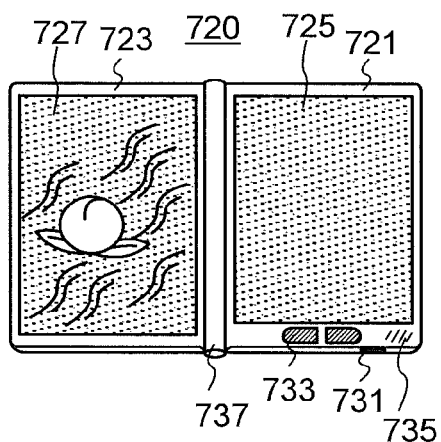

FIG. 14C is an e-book reader 720 mounting electronic paper. The e-book reader 720 has two housings of a housing 721 and a housing 723. The housing 721 and the housing 723 are provided with a display portion 725 and a display portion 727, respectively. The housing 721 and the housing 723 are connected by a hinge 737 and can be opened and closed with the hinge 737 as an axis. Further, the housing 721 is provided with a power switch 731, operation keys 733, a speaker 735, and the like. At least one of the housing 721 and the housing 723 is provided with the semiconductor device described in any of the above embodiments. Therefore, the e-book reader can perform writing and reading data at high speed, store data for a long time, and operate with sufficiently low power consumption.

FIG. 14D is a mobile phone including two housings of a housing 740 and a housing 741. Further, the housing 740 and the housing 741 in a state where they are developed as illustrated in FIG. 14D can shift by sliding so that one is lapped over the other; therefore, the size of the mobile phone can be reduced, which makes the mobile phone suitable for being carried. The housing 741 is provided with a display panel 742, a speaker 743, a microphone 744, a pointing device 746, a camera lens 747, an external connection terminal 748, and the like. The display panel 742 has a touch panel function. A plurality of operation keys 745 which are displayed as images is illustrated by dashed lines in FIG. 14D. The housing 740 is provided with a solar cell 749 that charges the mobile phone, an external memory slot 750, and the like. Further, an antenna is incorporated in the housing 741. At least one of the housing 740 and the housing 741 is provided with the semiconductor device described in any of the above embodiments. Therefore, the mobile phone can perform writing and reading data at high speed, store data for a long time, and operate with sufficiently low power consumption.

FIG. 14E is a digital camera including a main body 761, a display portion 767, an eyepiece 763, an operation switch 764, a display portion 765, a battery 766, and the like. The semiconductor device described in any of the above embodiments is provided in the main body 761. Therefore, the digital camera can perform writing and reading data at high speed, store data for a long time, and operate with sufficiently low power consumption.

Figure 14F:
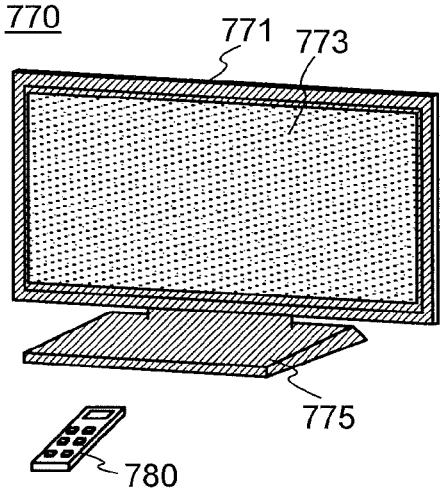

FIG. 14F is a television device 770 including a housing 771, a display portion 773, a stand 775, and the like. The television device 770 can be operated by an operation switch of the housing 771 or a separate remote controller 780. The semiconductor devices described in any of the above embodiments are provided for the housing 771 and the remote controller 780. Therefore, the television device can perform writing and reading data at high speed, store data for a long time, and operate with sufficiently low power consumption.

Thus, the semiconductor device of any of the above embodiments is provided for the electronic devices described in Embodiment 7. Accordingly, electronic devices with low power consumption can be realized.

EXAMPLE 1

Figure 15:
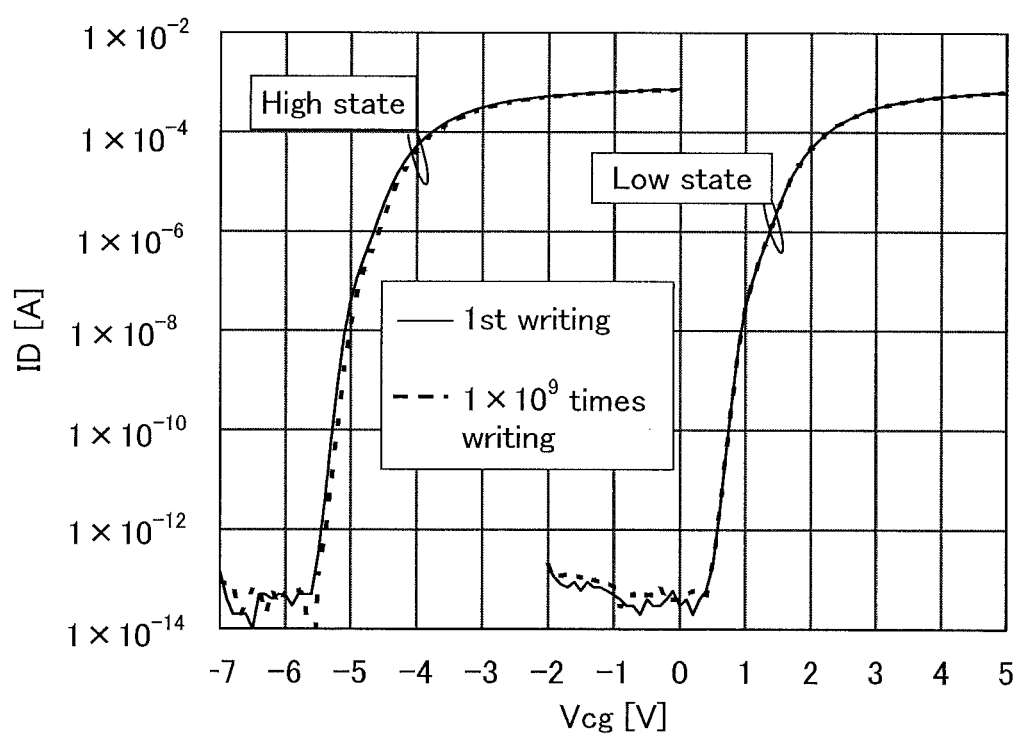
FIG. 15 is a graph showing evaluation results of a memory window width.

The number of times of rewriting data in a semiconductor device of one embodiment of the disclosed invention was examined. In Example 1, the examination results will be described with reference to FIG. 15.

A semiconductor device used for the examination is the semiconductor device having the circuit structure in FIG. 1A. Here, an oxide semiconductor was used for a transistor corresponding to the transistor 162, and a capacitor with a capacitance value of 0.33 pF was used as a capacitor corresponding to the capacitor 164.

The examination was performed by comparing the initial memory window width and the memory window width at the time after storing and writing data were repeated predetermined times. Data was stored and written by applying 0 V or 5 V to a wiring corresponding to the third wiring in FIG. 1A and applying 0 V or 5 V to a wiring corresponding to the fourth wiring in FIG. 1A. When the potential of the wiring corresponding to the fourth wiring is 0 V, the transistor (writing transistor) corresponding to the transistor 162 is off; thus, a potential supplied to a floating gate portion FG is held. When the potential of the wiring corresponding to the fourth wiring is 5 V, the transistor corresponding to the transistor 162 is on; thus, a potential of the wiring corresponding to the third wiring is supplied to the floating gate portion FG.

The memory window width is one of indicators of the characteristics of a memory device. Here, the memory window width represents the shift amount $\Delta Vcg$ in curves (Vcg-Id curves) between different memory states, which show the relation between the potential Vcg of a wiring corresponding to the fifth wiring and a drain current Id of a transistor (reading transistor) corresponding to the transistor 160. The different memory states mean a state where 0 V is applied to a floating gate portion FG (hereinafter referred to as a Low state) and a state where 5 V is applied to a floating gate portion FG (hereinafter referred to as a High state). That is, the memory window width can be checked by sweeping the potential Vcg in the Low state and in the High state. In both cases, a voltage Vds which is a potential difference between a drain potential and a source potential with respect to the source potential as a reference potential is 1 V.

Figure 19:
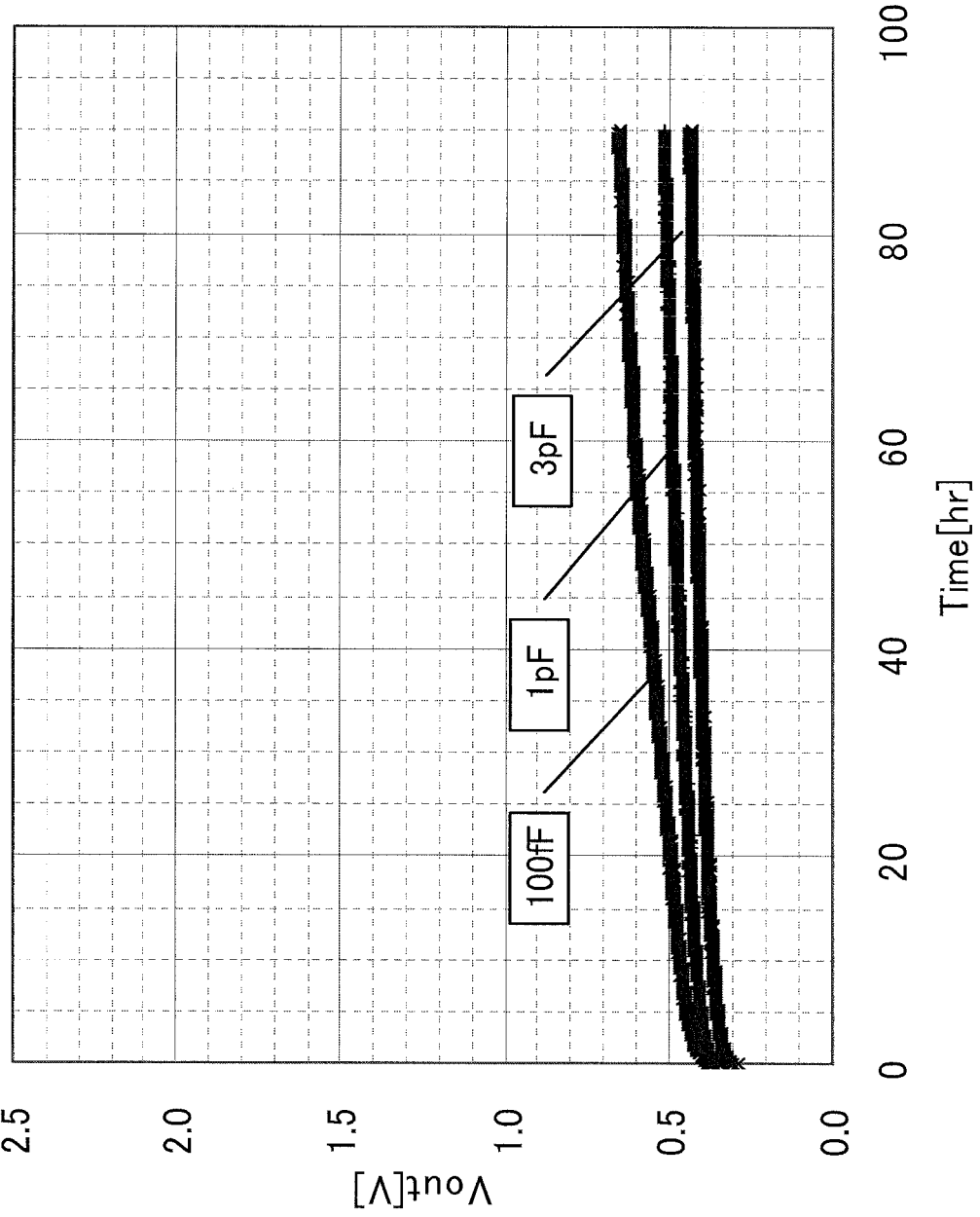
FIG. 19 is a graph showing the characteristics of a transistor including an oxide semiconductor.

FIG. 19 shows the initial memory window width and the examination results of the memory window width at the time after writing was performed $1 \times 10^9$ times. Solid lines represent characteristic curves in the first writing, and dashed lines represent characteristic curves after writing was performed $1 \times 10^9$ times. In both the solid lines and the dashed lines, the left curves are the characteristic curves in the High state and the right curves are the characteristic curves in the Low state. Further, the horizontal axis shows Vcg (V) and the vertical axis shows Id (A). According to FIG. 15, the memory window width sweeping the potential Vcg was not changed in comparing between the High state and the Low state, before and after data was written $1 \times 10^9$ times, which means that at least during the period, the characteristics of the semiconductor device are not changed.

As described above, in a semiconductor device of one embodiment of the disclosed invention, characteristics are not changed even after data is stored and written $1 \times 10^9$ times and resistance against rewriting is very high. That is, it can be said that according to one embodiment of the disclosed invention, a significantly reliable semiconductor device can be realized.

EXAMPLE 2

In Example 2, results obtained by measuring the off-state current of a transistor including a purified oxide semiconductor will be described.

Figure 16:
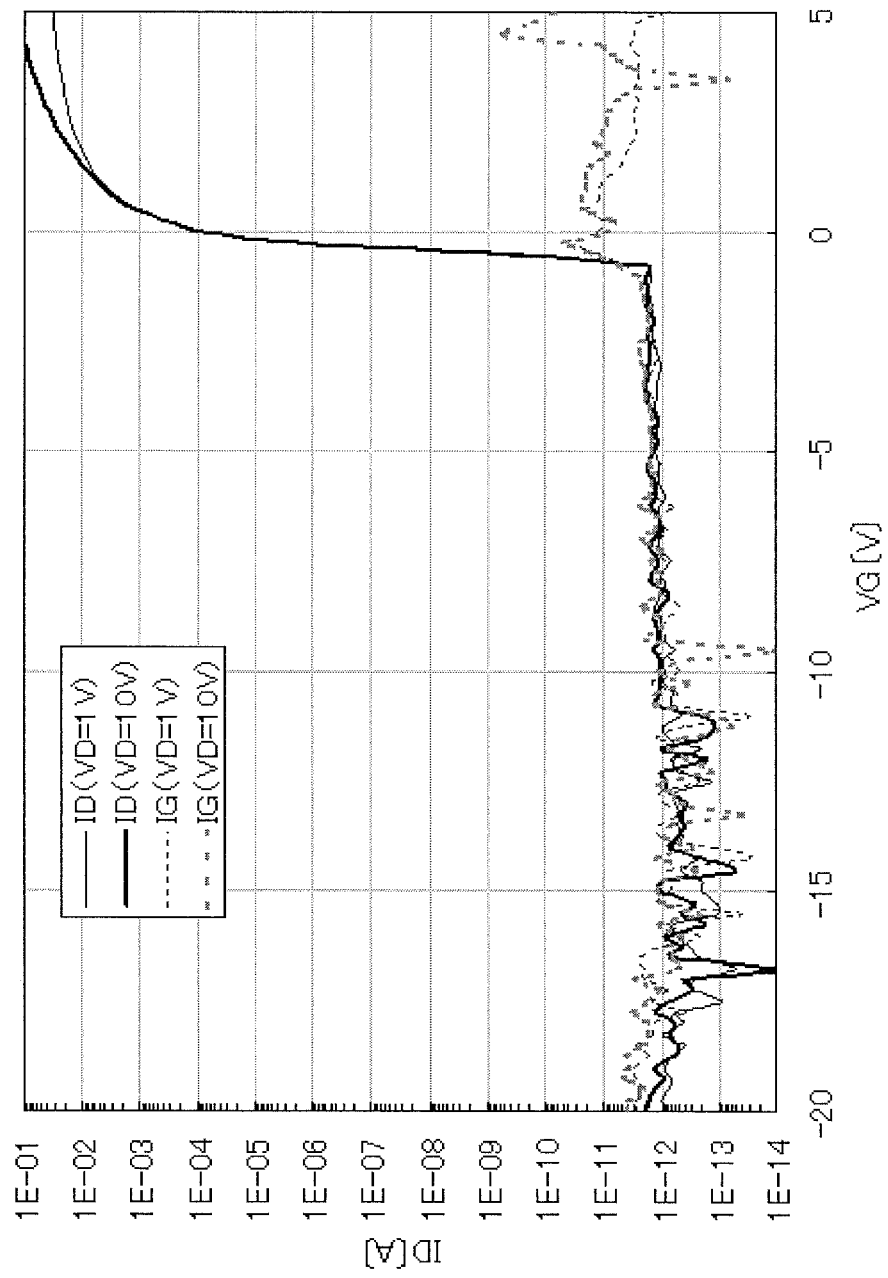
FIG. 16 is a graph showing the characteristics of a transistor including an oxide semiconductor.

In Example 2, a transistor including a highly-purified oxide semiconductor was formed in accordance with Embodiment 4. First, a transistor with a channel width (W) of 1 m, which was sufficiently wide, was prepared in consideration of the extremely low off-state current of a transistor including a highly-purified oxide semiconductor, and the off-state current was measured. FIG. 16 shows the results obtained by measurement of the off-state current of the transistor with a channel width (W) of 1 m. In FIG. 16, the horizontal axis shows a gate voltage VG and the vertical axis shows a drain current ID. In the case where the drain voltage VD is +1 V or +10 V and the gate voltage VG is within the range of −5 V to −20 V, the off-state current of the thin film transistor was found to be $1 \times 10^{-13}$ A or lower which is the detection limit. Moreover, it was found that the off current density of the transistor is 1 aA/μm ($1 \times 10^{-18}$ A/μm) or lower.

Next, the results will be described which are obtained by more accurately measuring the off-state current of a thin film transistor including a purified oxide semiconductor. As described above, the off-state current of the transistor including a purified oxide semiconductor was found to be $1 \times 10^{-13}$ A or lower which is the measurement limit of measurement equipment. Here, the results obtained by measuring more accurate off-state current (the value smaller than or equal to the detection limit of measurement equipment in the above measurement), with the use of an element for characteristic evaluation, will be described.

First, the element for characteristic evaluation which was used in a method for measuring current will be described with reference to FIG. 17.

Figure 17:
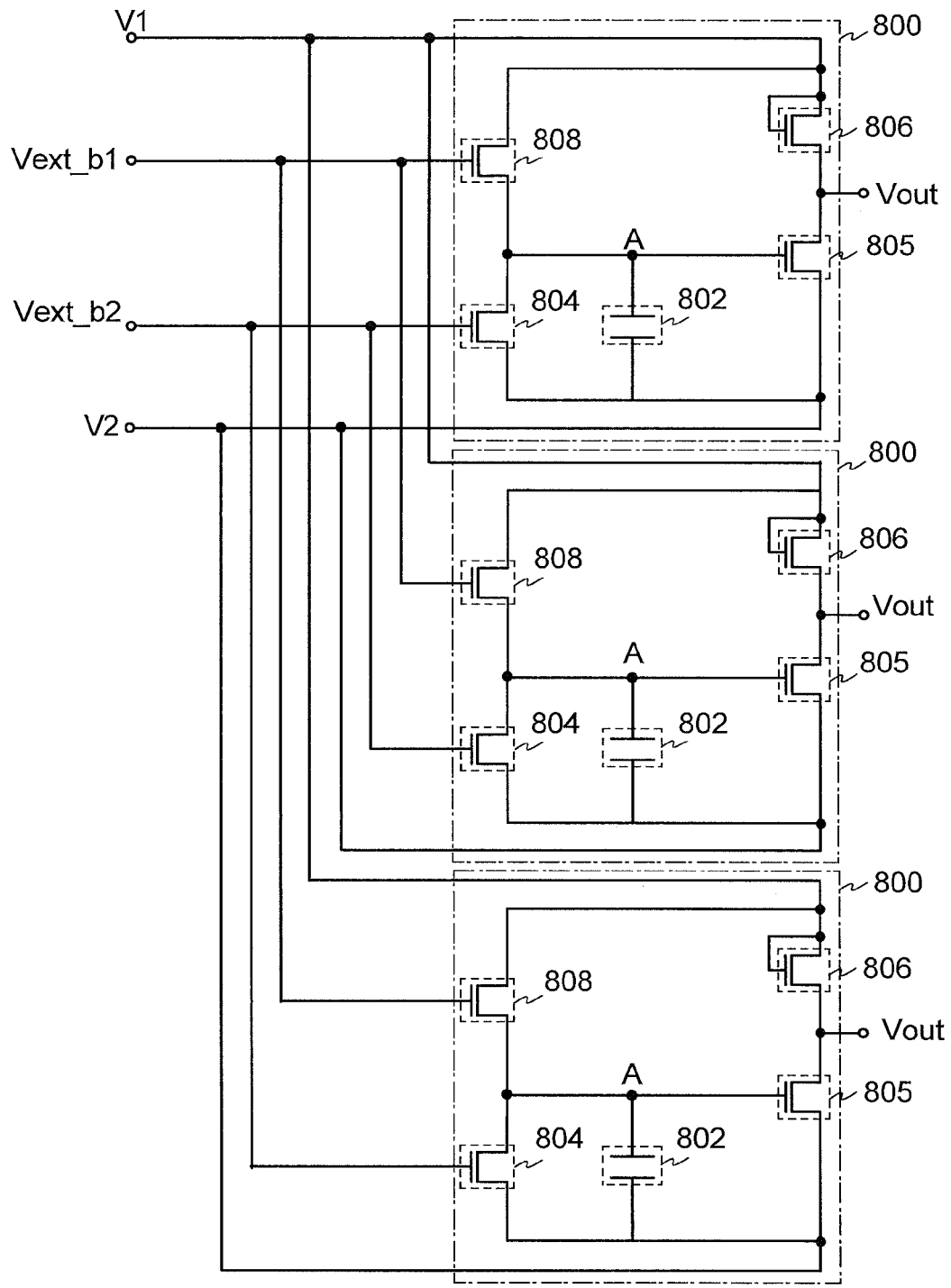
FIG. 17 is a circuit diagram for evaluating the characteristics of a transistor including an oxide semiconductor.

In the element for characteristic evaluation in FIG. 17, three measurement systems 800 are connected in parallel. The measurement system 800 includes a capacitor 802, a transistor 804, a transistor 805, a transistor 806, and a transistor 808. A transistor manufactured in accordance with Embodiment 4 was used as each of the transistors 804 and 808.

In the measurement system 800, one of a source terminal and a drain terminal of the transistor 804, one of terminals of the capacitor 802, and one of a source terminal and a drain terminal of the transistor 805 are connected to a power source (for supplying V2). The other of the source terminal and the drain terminal of the transistor 804, one of a source terminal and a drain terminal of the transistor 808, the other of the terminals of the capacitor 802, and a gate terminal of the transistor 805 are connected to one another. The other of the source terminal and the drain terminal of the transistor 808, one of a source terminal and a drain terminal of the transistor 806, and a gate terminal of the transistor 806 are connected to a power source (for supplying V1). The other of the source terminal and the drain terminal of the transistor 805 and the other of the source terminal and the drain terminal of the transistor 806 are connected to each other to output a potential Vout.

A potential Vext_b2 for controlling an on state and an off state of the transistor 804 is supplied to a gate terminal of the transistor 804. A potential Vext_b1 for controlling an on state and an off state of the transistor 808 is supplied to a gate terminal of the transistor 808. A potential Vout is output from the output terminal.

Next, a method for measuring current with the use of the measurement system will be described.

First, an initialization period in which a potential difference is applied to measure the off-state current will be described briefly. In the initialization period, the potential Vext_b1 for turning on the transistor 808 is input to the gate terminal of the transistor 808, and a potential V1 is supplied to a node A that is a node connected to the other of the source terminal and the drain terminal of the transistor 804 (that is, the node connected to one of the source terminal and the drain terminal of the transistor 808, the other of the terminals of the capacitor 802, and the gate terminal of the transistor 805). Here, the potential V1 is, for example, a high potential. The transistor 804 is off.

After that, the potential Vext_b1 for turning off the transistor 808 is input to the gate terminal of the transistor 808, so that the transistor 808 is turned off. After the transistor 808 is turned off, the potential V1 is set to low. The transistor 804 is still off. The potential V2 is the same potential as the potential V1. Thus, the initialization period is completed. In a state where the initialization period is completed, a potential difference is generated between the node A and one of a source terminal and a drain terminal of the transistor 804, and a potential difference is also generated between the node A and the other of the source terminal and the drain terminal of the transistor 808. Therefore, charge flows slightly through the transistor 804 and the transistor 808. In other words, an off-state current is generated.

Next, a measurement period of the off-state current will be described briefly. In the measurement period, the potential of one of the source terminal and the drain terminal of the transistor 804 (that is, the potential V2) and the potential of the other of the source terminal and the drain terminal of the transistor 808 (that is, the potential V1) are set to low and fixed. On the other hand, the potential of the node A is not fixed (the node A is in a floating state) in the measurement period. Accordingly, charge flows through the transistor 804 and the amount of charge held at the node A is changed as time goes by. Further, as the amount of charge held at the node A is changed, the potential of the node A varies. That is to say, the output potential Vout of the output terminal also varies.

Figure 18:
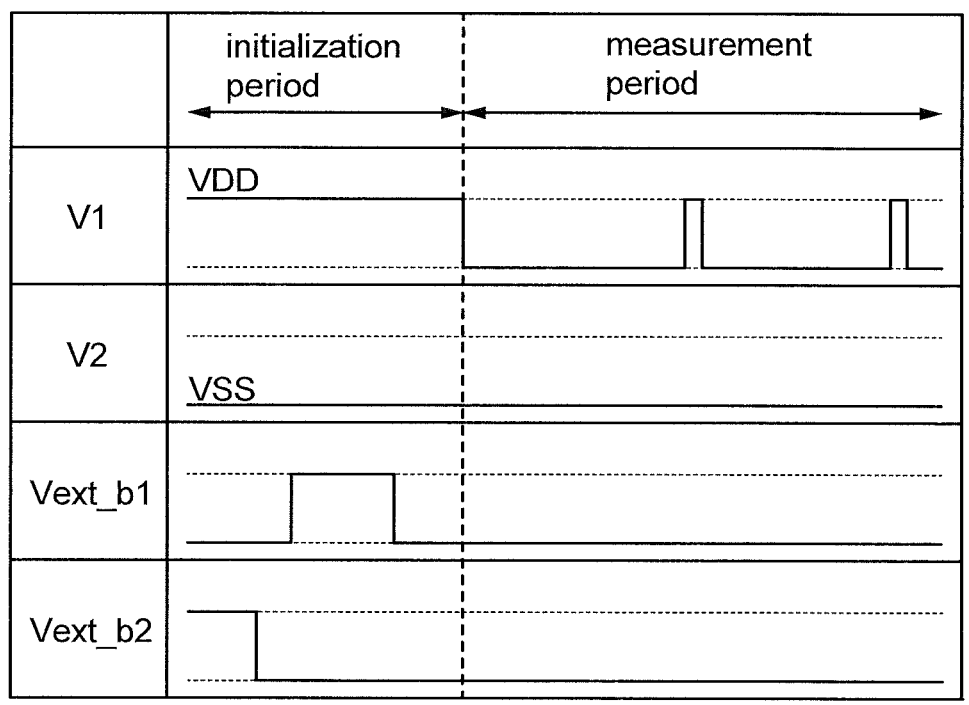
FIG. 18 is a timing diagram for evaluating the characteristics of a transistor including an oxide semiconductor.

FIG. 18 shows details (timing diagram) of the relation between potentials in the initialization period in which the potential difference is generated and in the following measurement period.

In the initialization period, first, the potential Vext_b2 is set to a potential (high potential) at which the transistor 804 is turned on. Thus, the potential of the node A comes to be V2, that is, a low potential (VSS). After that, the potential Vext_b2 is set to a potential (low potential) at which the transistor 804 is turned off, whereby the transistor 804 is turned off. Then, the potential Vext_b1 is set to a potential (high potential) at which the transistor 808 is turned on. Thus, the potential of the node A comes to be V1, that is, a high potential (VDD). After that, the potential Vext_b1 is set to a potential at which the transistor 808 is turned off. Accordingly, the node A is brought into a floating state and the initialization period is completed.

In the following measurement period, the potential V1 and the potential V2 are individually set to potentials at which charge flows to or from the node A. Here, the potential V1 and the potential V2 are low potentials (VSS). Note that at the timing of measuring the output potential Vout, it is necessary to operate an output circuit; thus, V1 is set to a high potential (VDD) temporarily in some cases. The period in which V1 is a high potential (VDD) is set to be short so that the measurement is not influenced.

When a potential difference is generated as described above to start the measurement period, the amount of charge held at the node A is changed as time goes by and accordingly, the potential of the node A varies. This means that the potential of the gate terminal of the transistor 805 varies and thus, the output potential Vout of the output terminal varies with the lapse of time.

A method for calculating the off-state current based on the obtained output potential Vout will be described below.

The relation between the potential $V_A$ of the node A and the output potential Vout is obtained in advance before the off-state current is calculated. Thus, the potential $V_A$ of the node A can be obtained based on the output potential Vout. From the relation described above, the potential $V_A$ of the node A can be expressed by the following equation as a function of the output potential Vout.

$$V_A = F(Vout) \quad \text{[FORMULA 1]}$$

Electric charge $Q_A$ of the node A is expressed by the following equation, using the potential $V_A$ of the node A, capacitance $C_A$ of a capacitor connected to the node A, and a constant (const). Here, the capacitance $C_A$ of the capacitor connected to the node A is the sum of capacitance of the capacitor 802 and the other capacitance.

$$Q_A = C_A V_A + \text{const} \quad \text{[FORMULA 2]}$$

Since a current $I_A$ of the node A is the time derivative of charge flowing to the node A (or charge flowing from the node A), the current $I_A$ of the node A is expressed by the following equation.

$$I_A \equiv \frac{\Delta Q_A}{\Delta t} = \frac{C_A \cdot \Delta F(Vout)}{\Delta t} \quad \text{[FORMULA 3]}$$

Thus, the current $I_A$ of the node A can be obtained based on the capacitance $C_A$ of the capacitor connected to the node A and the output potential Vout of the output terminal.

By the method described above, a leakage current (off-state current) flowing between the source and the drain of the transistor which is off can be calculated.

In Example 2, the transistor 804 and the transistor 808 were manufactured using a purified oxide semiconductor. The ratio of the channel length (L) to the channel width (W) of the transistors was L/W=1/5. In the measurement systems 800 arranged in parallel, capacitance values of capacitors 802 were 100 ff, 1 pF, and 3 pF, respectively.

Note that the measurement according to Example 2, VDD was 5 V and VSS was 0 V. In the measurement period, the potential V1 was basically set to VSS and set to VDD only in a period of 100 msec every 10 to 300 seconds, and Vout was measured. Further, Δt used in calculation of the current $I_A$ flowing through an element was approximately 30,000 seconds.

FIG. 19 shows the relation between the output potential Vout and elapsed time Time in the current measurement. According to FIG. 19, the potential varies as time goes by.

Figure 20:
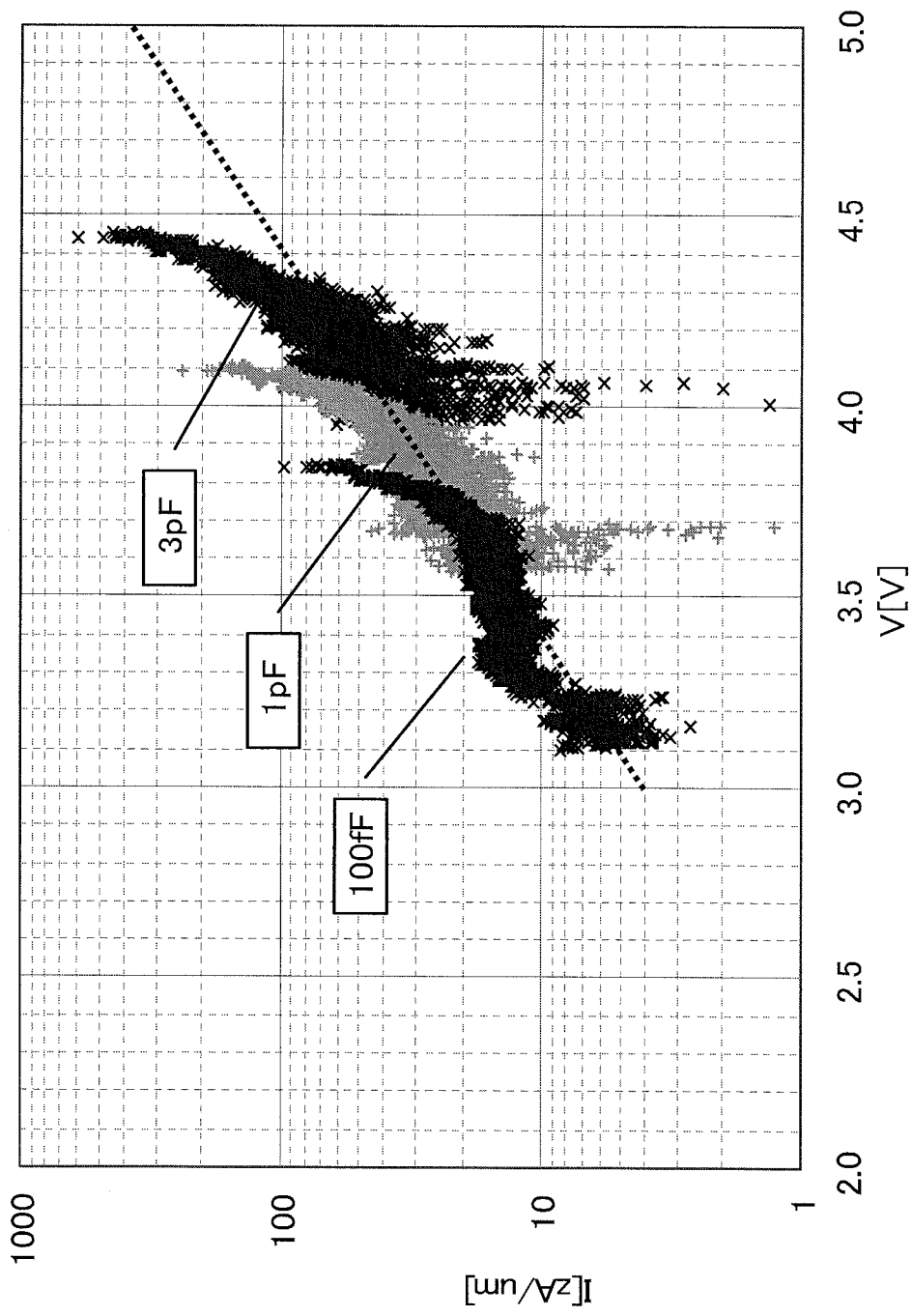
FIG. 20 is a graph showing the characteristics of a transistor including an oxide semiconductor.

FIG. 20 shows the off-state current calculated based on the above current measurement. Note that FIG. 20 shows the relation between a source-drain voltage V and an off-state current I. According to FIG. 20, an off-state current was approximately 40 zA/μm, when the source-drain voltage was 4 V. When the source-drain voltage was 3.1 V, the off-state current was 10 zA/μm or lower. Note that 1 zA is equivalent to $10^{-21}$ A.

According to Example 2, it was confirmed that the off-state current could be sufficiently low in a transistor including a purified oxide semiconductor.

This application is based on Japanese Patent Application serial No. 2010-007517 filed with the Japan Patent Office on Jan. 15, 2010, the entire contents of which are hereby incorporated by reference.

The invention claimed is:

1. A semiconductor device comprising:
   semiconductor substrate including a channel formation region and a pair of impurity regions;
   a first gate insulating layer over the channel formation region;
   a first gate electrode over the gate insulating layer;
   a first interlayer insulating layer over the gate electrode;
   a source electrode and a drain electrode over the first interlayer insulating layer;
   an oxide semiconductor layer adjacent to the source electrode and the drain electrode;
   a second gate insulating layer adjacent to the oxide semiconductor layer;
   a second gate electrode and an electrode adjacent to the second gate insulating layer; and
   a second interlayer insulating layer over the second gate electrode and the electrode,
   wherein a capacitor is formed between the electrode and one of the source electrode and the drain electrode, and
   wherein the source electrode and the drain electrode have a tapered shape with a taper angle from 30° to 60° inclusive.

2. The semiconductor device according to claim 1, wherein the semiconductor substrate is a single crystal semiconductor substrate.

3. The semiconductor device according to claim 1, wherein the other of the source electrode and the drain electrode is electrically connected to a first signal line, and wherein the second gate electrode is electrically connected to a second signal line.

4. The semiconductor device according to claim 1, wherein the electrode is electrically connected to a word line.

5. The semiconductor device according to claim 1, wherein each of the pair of impurity regions is electrically connected to a source-bit line.

6. The semiconductor device according to claim 1, wherein the oxide semiconductor layer is in direct contact with the first interlayer insulating layer.

7. The semiconductor device according to claim 1, wherein the semiconductor device is incorporated in one selected from the group consisting of a laptop computer, a portable information terminal, an e-book reader, a mobile phone, a digital camera, and a television device.

8. A semiconductor device comprising:
- a semiconductor substrate including a channel formation region and a pair of impurity regions;
- a first gate insulating layer over the channel formation region;
- a first gate electrode over the gate insulating layer;
- a first interlayer insulating layer over the gate electrode;
- a source electrode and a drain electrode over the first interlayer insulating layer;
- an oxide semiconductor layer adjacent to the source electrode and the drain electrode;
- a second gate insulating layer adjacent to the oxide semiconductor layer;
- a second gate electrode and an electrode adjacent to the second gate insulating layer; and
- a second interlayer insulating layer over the second gate electrode and the electrode,
- wherein the first gate electrode is electrically connected to one of the source electrode and the drain electrode,
- wherein a capacitor is formed between the electrode and the one of the source electrode and the drain electrode, and
- wherein the source electrode and the drain electrode have a tapered shape with a taper angle from 30° to 60° inclusive.

9. The semiconductor device according to claim 8, wherein the semiconductor substrate is a single crystal semiconductor substrate.

10. The semiconductor device according to claim 8, wherein the other of the source electrode and the drain electrode is electrically connected to a first signal line, and wherein the second gate electrode is electrically connected to a second signal line.

11. The semiconductor device according to claim 8, wherein the electrode is electrically connected to a word line.

12. The semiconductor device according to claim 8, wherein each of the pair of impurity regions is electrically connected to a source-bit line.

13. The semiconductor device according to claim 8, wherein the oxide semiconductor layer is in direct contact with the first interlayer insulating layer.

14. The semiconductor device according to claim 8, wherein the semiconductor device is incorporated in one selected from the group consisting of a laptop computer, a portable information terminal, an e-book reader, a mobile phone, a digital camera, and a television device.

* * * * *